US012142210B2

(12) United States Patent
Wang et al.

(10) Patent No.: US 12,142,210 B2
(45) Date of Patent: Nov. 12, 2024

(54) DISPLAY PANEL AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Yu Wang, Beijing (CN); Yao Huang, Beijing (CN); Binyan Wang, Beijing (CN); Cong Liu, Beijing (CN); Benlian Wang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/789,566

(22) PCT Filed: Sep. 30, 2021

(86) PCT No.: PCT/CN2021/122084
§ 371 (c)(1),
(2) Date: Jun. 28, 2022

(87) PCT Pub. No.: WO2023/050269
PCT Pub. Date: Apr. 6, 2023

(65) Prior Publication Data
US 2024/0212599 A1    Jun. 27, 2024

(51) Int. Cl.
*G09G 3/3233* (2016.01)
*H10K 59/121* (2023.01)
*H10K 59/131* (2023.01)

(52) U.S. Cl.
CPC ....... *G09G 3/3233* (2013.01); *H10K 59/1213* (2023.02); *H10K 59/1315* (2023.02);
(Continued)

(58) Field of Classification Search
CPC ......... G09G 3/3233; G09G 2300/0426; G09G 2320/0233; H10K 59/1213; H10K 59/1315
See application file for complete search history.

(56) References Cited

U.S. PATENT DOCUMENTS 7,994,712 B2 *  8/2011  Sung ............... H10K 50/852
                                                    313/511
10,199,437 B2 *  2/2019  Kim ................. G09G 3/3225
(Continued)

FOREIGN PATENT DOCUMENTS

CN    202855739 U    4/2013
CN    103268746 A    8/2013
(Continued)

*Primary Examiner* — Mihir K Rayan
(74) *Attorney, Agent, or Firm* — HOUTTEMAN LAW LLC

(57) ABSTRACT

A display panel includes a base substrate, a driving circuit layer on the base substrate and a light emitting structure layer, the driving circuit layer includes a plurality of circuit units, and the light emitting structure layer includes a plurality of light emitting devices; at least one circuit unit includes a plurality of initial signal lines and a pixel driving circuit including a plurality of transistors, which includes at least one oxide thin film transistor and at least one low-temperature polycrystalline silicon thin film transistor; the plurality of initial signal lines each include a signal sub-line in a first direction, at least one initial signal line includes a signal sub-line extending in a second direction intersecting with the first direction; the signal sub-line extending in the first direction and the signal sub-line extending in the second direction of the initial signal line are electrically connected to each other.

20 Claims, 16 Drawing Sheets

(52) U.S. Cl.
CPC ............... *G09G 2300/0426* (2013.01); *G09G 2320/0233* (2013.01)

(56) References Cited

U.S. PATENT DOCUMENTS

| | | | |
|---|---|---|---|
| 10,417,960 B2* | 9/2019 | Xiang | .................. G09G 3/3225 |
| 10,551,702 B1 | 2/2020 | Yang | |
| 11,348,521 B2* | 5/2022 | Cho | ..................... G09G 3/3233 |
| 2009/0174630 A1* | 7/2009 | Chan | .................. H10K 59/8792 |
| | | | 345/76 |
| 2012/0104233 A1 | 5/2012 | Mori et al. | |
| 2019/0073957 A1 | 3/2019 | Yang et al. | |

FOREIGN PATENT DOCUMENTS

| | | | |
|---|---|---|---|
| CN | 103578426 A | 2/2014 | |
| CN | 104077999 A | 10/2014 | |
| CN | 204117565 U | 1/2015 | |
| CN | 104882450 A | 9/2015 | |
| CN | 107664891 A | 2/2018 | |
| CN | 110335564 A | 10/2019 | |
| CN | 110824795 A | 2/2020 | |
| CN | 111179855 A | 5/2020 | |
| CN | 112071268 A | 12/2020 | |
| CN | 112397029 A | 2/2021 | |
| CN | 112562593 A | 3/2021 | |
| CN | 112885850 A | 6/2021 | |
| CN | 113078174 A | 7/2021 | |
| CN | 113224123 A | 8/2021 | |
| KR | 102199338 B1 | 1/2021 | |
| WO | 2020161877 A1 | 8/2020 | |
| WO | 2021102904 A1 | 6/2021 | |

* cited by examiner

DISPLAY PANEL AND DISPLAY APPARATUS

TECHNICAL FIELD

The present disclosure belongs to the field of display technology, and particularly relates to a display panel and a display apparatus.

BACKGROUND

Active Matrix Organic Light Emitting Diode (AMOLED) display panels are applied more and more widely. A display device based on AMOLED is an Organic Light Emitting Diode (OLED), and the AMOLED can emit light through driving a thin film transistor to generate a driving current in a saturated state, and the driving current drives the light emitting device to emit light.

SUMMARY

The present disclosure is directed to at least one of the problems in the related art, and provides a display panel and a display apparatus.

In a first aspect, an embodiment of the present disclosure provides a display panel, including a base substrate, a driving circuit layer on the base substrate and a light emitting structure layer on a side of the driving circuit layer away from the base substrate, wherein the driving circuit layer includes a plurality of circuit units, and the light emitting structure layer includes a plurality of light emitting devices; at least one of the plurality of circuit units includes a plurality of initial signal lines and a pixel driving circuit; the pixel driving circuit includes a plurality of transistors, which include at least one oxide thin film transistor and at least one low-temperature polycrystalline silicon thin film transistor;
  the plurality of initial signal lines each include a signal sub-line in a first direction, at least one of the plurality of initial signal lines includes a signal sub-line extending in a second direction: the first direction and the second direction intersect with each other: the signal sub-line extending in the first direction of the initial signal line and the signal sub-line extending in the second direction of the initial signal line are electrically connected to each other;
  the driving circuit layer includes a first semiconductor layer, a first conductive layer, a second semiconductor layer, a third conductive layer, a fourth conductive layer and a fifth conductive layer which are sequentially arranged in a direction away from the base substrate;
  the first semiconductor layer includes an active layer of the low-temperature polycrystalline silicon thin film transistor;
  the first conductive layer includes a gate electrode of the low-temperature polycrystalline silicon thin film transistor;
  the second conductive layer includes a first gate electrode of the oxide thin film transistor and at least one signal sub-line extending in the first direction;
  the second semiconductor layer includes an active layer of the oxide thin film transistor;
  the third conductive layer includes a second gate electrode of the oxide thin film transistor;
  the fourth conductive layer includes at least one signal sub-line extending in the first direction; and the fifth conductive layer includes the signal sub-line extending in the second direction.

The plurality of initial signal lines include a first initial signal line and a second initial signal line:
  the at least one signal sub-line extending in the first direction in the second conductive layer includes a first signal sub-line of the first initial signal line;
  the at least one signal sub-line extending in the first direction in the fourth conductive layer includes a third signal sub-line of the second initial signal line; and
  the signal sub-lines extending in the second direction in the fifth conductive layer include a third signal sub-line of the first initial signal line, and/or a fourth signal sub-line of the second initial signal line.

In a case where the first initial signal line includes the first signal sub-line and the second signal sub-line, the fourth conductive layer further includes a plurality of first connecting electrodes; the first signal sub-line is electrically connected to a first region of an active layer of a first transistor in the pixel driving circuit through a via; the first region of the active layer of the first transistor is electrically connected to the first connecting electrode through a via; the first connecting electrode is electrically connected to the second signal sub-line through a via; and
  in a case where the second initial signal line includes the third signal sub-line and the fourth signal sub-line, the third signal sub-line is electrically connected to the fourth signal sub-line through a via.

The driving circuit layer includes a plurality of unit rows and a plurality of unit columns, each of the plurality of unit rows includes a plurality of circuit units arranged side by side in the first direction; and each of the plurality of unit columns includes a plurality of circuit units arranged side by side in the second direction;
  in a case where the first initial signal line includes the first signal sub-line and the second signal sub-line, in at least one of the plurality of unit columns, the second signal sub-lines in the circuit units adjacent to each other are connected to each other; and
  in a case where the second initial signal line includes the third signal sub-line and the fourth signal sub-line, in at least one of the plurality of unit columns, the fourth signal sub-lines in the circuit units adjacent to each other are connected to each other.

The plurality of light emitting devices include a red light emitting device, a first green light emitting device, a second green light emitting device, and a blue light emitting device: the plurality of circuit units include a first circuit unit electrically connected to the red light emitting device, a second circuit unit electrically connected to the blue light emitting device, a third circuit unit electrically connected to the first green light emitting device, and a fourth circuit unit electrically connected to the second green light emitting device: the plurality of unit columns include a first unit column and a second unit column, the first unit column includes the first circuit units and the second circuit units alternately arranged in the second direction, and the second unit column includes the third circuit units and the fourth circuit units alternately arranged in the second direction:
  in a case where the first initial signal line includes the first signal sub-line and the second signal sub-line, at least a part of the second signal sub-lines are in the second unit column;
  in a case where the second initial signal line includes a third signal sub-line and the fourth signal sub-line, at least a part of the fourth signal sub-lines are in the second unit column.

The fifth conductive layer further includes a plurality of first power lines: in a same unit column, the first power lines in the circuit units adjacent to each other are connected to each other; and the second signal sub-line and the fourth signal sub-line are between the first power lines in the two unit columns connected to the second signal sub-line and the fourth signal sub-line.

The driving circuit layer includes a plurality of unit structures arranged side by side in the first direction: each of the plurality of unit structures includes two unit columns which are adjacent to each other;

a first power line in the circuit unit includes a first line segment and a second line segment extending in a second direction and electrically connected to each other; in the unit column, the first line segment of the first power line in one of the circuit units adjacent to each other is electrically connected to the second line segment in the other of the circuit units adjacent to each other: in the unit structure, a distance between the second segments adjacent to each other in the first direction is less than a distance between the first segments adjacent to each other; and the fourth conductive layer further includes a plurality of second connecting electrodes: in the unit structure, the second connecting electrode electrically connects the second line segments adjacent to each other in the first direction together through vias.

The fifth conductive layer further includes a plurality of data lines: in the unit column, the data lines adjacent to each other are connected to each other; and the first power line includes a first side and a second side which are oppositely arranged in a first direction: the data line in the first unit column is on the first side of the first power line, and the data line in the second unit column is on the second side of the first power line.

The first power line includes a first side and a second side which are oppositely arranged in a first direction: the data line in the first unit column is on the first side of the first power line, and the data line in the second unit column is on the second side of the first power line.

The fourth conductive layer further includes a plurality of fourth connecting electrodes: each of the plurality of fourth connecting electrode is electrically connected to a gate electrode of a third transistor in the pixel driving circuit through a via; and a second region of an active layer of a first transistor and a first region of a second transistor in the pixel driving circuit are electrically connected to the fourth connecting electrode through a via.

The fourth conductive layer further includes a plurality of fifth connecting electrodes: each of the plurality of fifth connecting electrode is electrically connected to a second region of an active layer of the third transistor in the pixel driving circuit through a via, and a second region of an active layer of a second transistor in the pixel driving circuit is electrically connected to the fifth connecting electrode through a via.

The fourth conductive layer further includes a plurality of sixth connecting electrodes and a plurality of seventh connecting electrodes: each of the plurality of sixth connecting electrode is electrically connected to a second region of an active layer of a sixth transistor through a via: the sixth connecting electrode is electrically connected to one of the plurality of seventh connecting electrodes through a via; and an anode of the light emitting device is electrically connected to the seventh connecting electrode through a via.

The display panel further includes a shielding electrode layer on a side of the first semiconductor layer close to the base substrate, wherein the shielding electrode layer includes a plurality of shielding electrodes: an orthographic projection of each of the plurality of shielding electrodes on the base substrate covers an orthographic projection of an active layer of a third transistor in the pixel driving circuit on the base substrate.

The shielding electrodes arranged side by side in the first direction are electrically connected to each other; and the shielding electrodes arranged side by side in the second direction are electrically connected to each other.

The shielding electrode layer is electrically connected to a first power line through a via.

The first conductive layer further includes a first scan line, a light emitting control line and a first plate of a storage capacitor in the pixel driving circuit:

the second conductive layer further includes a second plate of the storage capacitor, a first part of the second scan line and a first part of the first reset signal line; and the third conductive layer further includes a second part of the second scan line and a second part of the first reset signal line.

In a second aspect, an embodiment of the present disclosure further provides a display apparatus, which includes any one of the display panels described above.

DETAIL DESCRIPTION OF EMBODIMENTS

In order enable one of ordinary skill in the art to better understand the technical solutions of the present disclosure, the present disclosure is further described in detail with reference to the accompanying drawings and the detailed description below.

Unless defined otherwise, technical or scientific terms used herein shall have the ordinary meaning as understood by one of ordinary skill in the art to which the present disclosure belongs. The words "first", "second", and the like used in the present disclosure do not denote any order, quantity, or importance, but rather distinguish one element from another. Likewise, the word "a", "an", or "the" or the like does not denote a limitation of quantity, but rather denotes the presence of at least one. The word "comprising" or "comprises", or the like, means that an element or item preceding the word includes the element or item listed after the word and its equivalent, but does not exclude other elements or items. The word "connected" or "coupled" or the like is not restricted to physical or mechanical connections, but may include electrical connections, whether direct or indirect. The words "upper", "lower", "left", "right", and the like are used only to indicate relative positional relationships, and when an absolute position of an object being described is changed, the relative positional relationships may alternatively be changed accordingly.

Figure 1A:
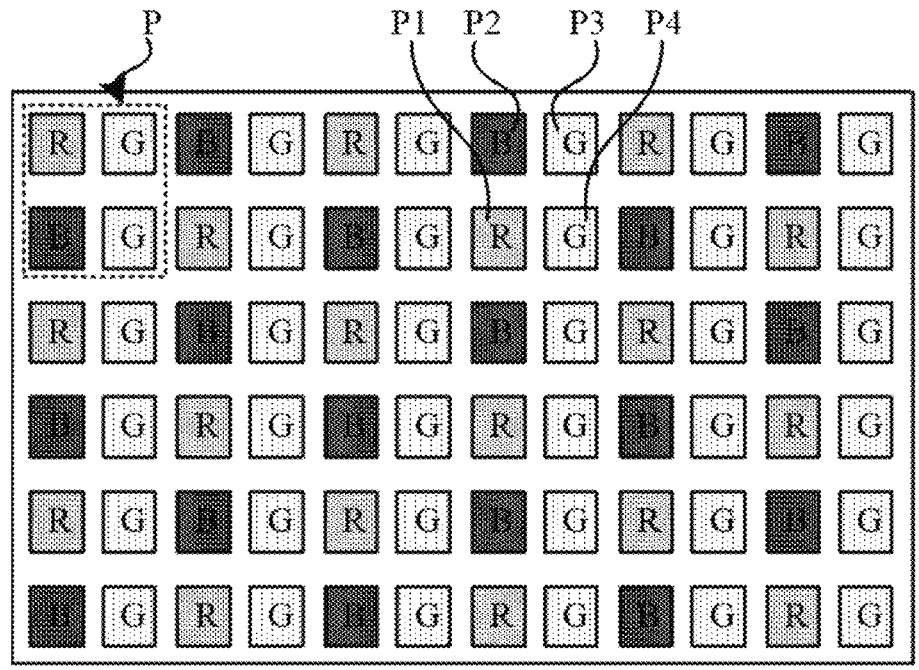
FIGS. 1a and 1b each are a plan view illustrating a structure of a display panel.
Figure 1B:
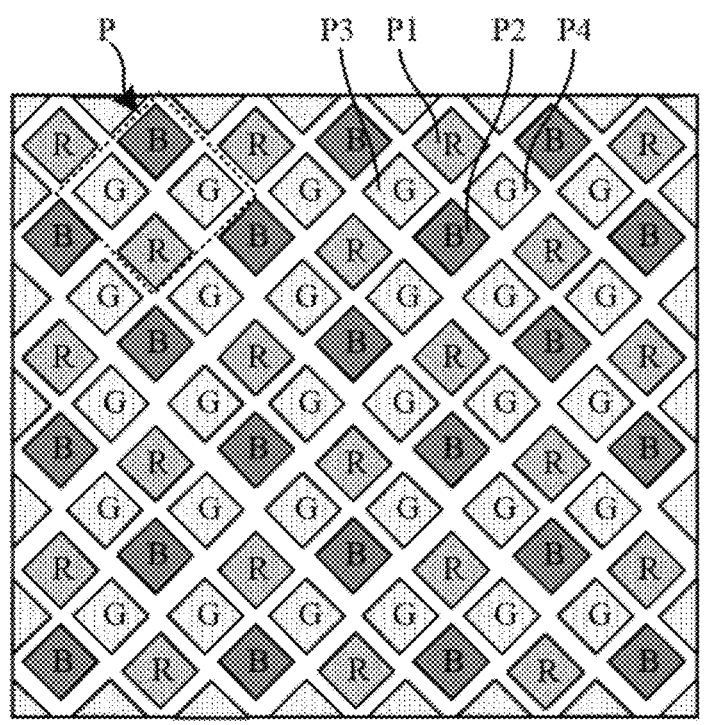

FIGS. 1*a* and 1*b* each is a plan view illustrating a structure of a display panel. In an exemplary embodiment, the display panel may include a plurality of pixel units P arranged in an array. At least one of the pixel units P may include one first sub-pixel P1 emitting light of a first color, one second sub-pixel P2 emitting light of a second color, and two sub-pixels, i.e. a third sub-pixel P3 and a fourth sub-pixel P4, emitting light of a third color. The four sub-pixels may each include a circuit unit and a light emitting device. The circuit unit may include a scan signal line, a data signal line, and a light emitting signal line and a pixel driving circuit. The pixel driving circuit is connected to the scan signal line, the data signal line, and the light emitting signal line, and the pixel driving circuit is configured to receive a data voltage transmitted from the data signal line and output a corresponding current to the light emitting device under the control of the scan signal line and the light emitting signal line. The light emitting device in each sub-pixel is connected to the pixel driving circuit of the sub-pixel, and the light emitting device is configured to emit light with corresponding brightness in response to the current output by the pixel driving circuit of the sub-pixel.

In some examples, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In an exemplary embodiment, a shape of the sub-pixel may be a rectangle, a diamond, a pentagon, or a hexagon. In one exemplary embodiment, the four sub-pixels may be arranged in a Square manner to form a GGRB pixel arrangement, as shown in FIG. 2*a*. In another exemplary embodiment, the four sub-pixels may be arranged in a Diamond manner to form an RGBG pixel arrangement, as shown in FIG. 1*b*. In other exemplary embodiments, the four sub-pixels may be arranged in a horizontal or vertical juxtaposition manner. In an exemplary embodiment, the pixel unit may include three sub-pixels, and the three sub-pixels may be arranged in a horizontal juxtaposition manner, a vertical juxtaposition manner, or a delta manner, which is not limited in the present disclosure.

Figure 2:
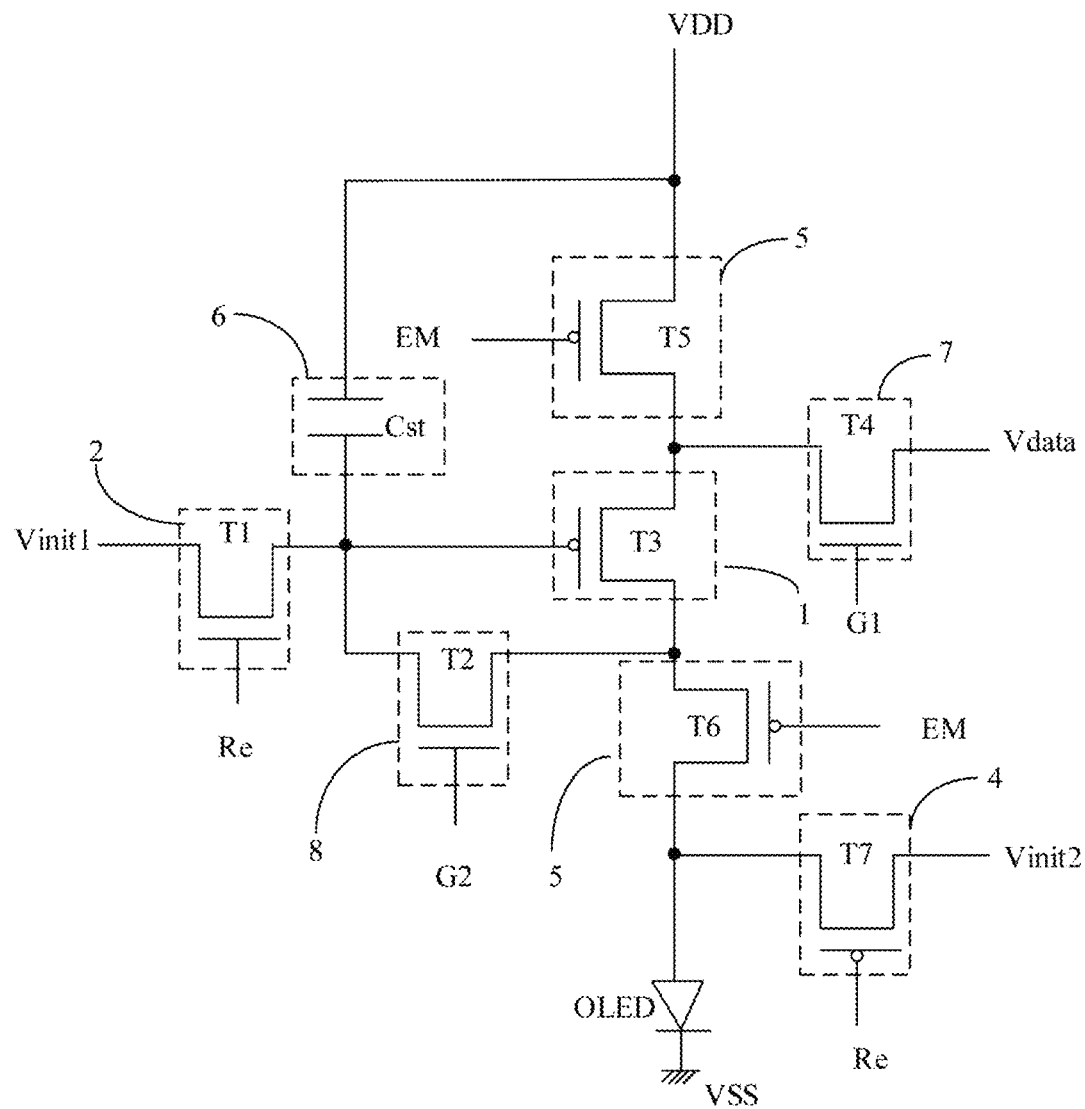
FIG. 2 is a schematic diagram illustrating an exemplary pixel driving circuit.
Figure 3:
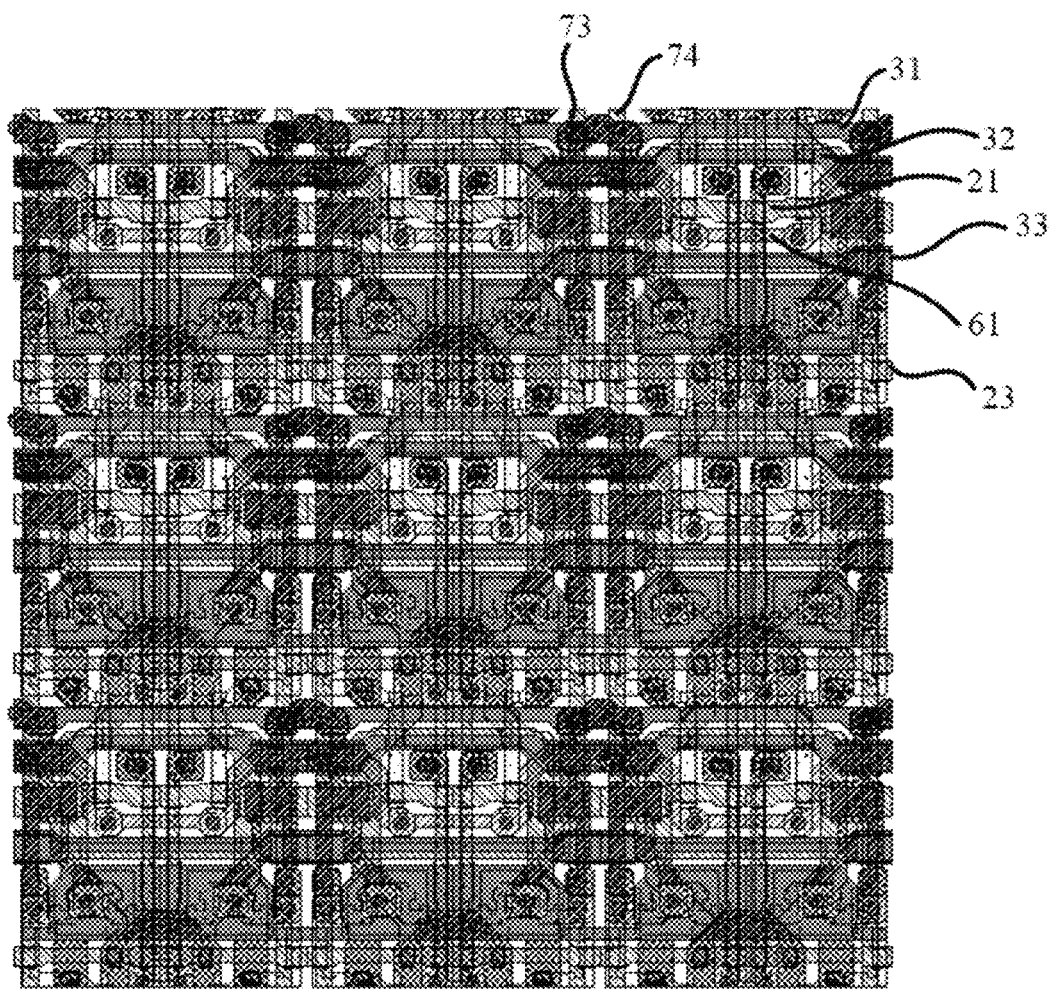
FIG. 3 is a layout of a display panel according to an embodiment of the present disclosure.

In an exemplary embodiment, a plurality of sub-pixels sequentially arranged in a horizontal direction are referred to as a pixel row, a plurality of sub-pixels sequentially arranged in a vertical direction are referred to as a pixel column, and a plurality of pixel rows and a plurality of pixel columns form a pixel array arranged in an array. FIG. 2 is a schematic diagram illustrating an exemplary pixel driving circuit. As shown in FIG. 2, the pixel driving circuit may include: a first reset sub-circuit 2, a threshold compensation sub-circuit 81, a driving sub-circuit 1, a data writing sub-circuit 14, a first light emitting control sub-circuit 51, a second light emitting control sub-circuit 52, a second reset sub-circuit 4, and a storage sub-circuit 6. The first reset sub-circuit 2 is connected to a control terminal of the driving sub-circuit 1 and is configured to reset the control terminal of the driving sub-circuit 1 under the control of a first reset signal. The threshold compensation sub-circuit 8 is electrically connected to the control terminal and a second terminal of the driving sub-circuit 1, and is configured to perform threshold compensation on the driving sub-circuit 1. The data writing sub-circuit 14 is electrically connected to a first terminal of the driving sub-circuit 1 and is configured to write a data signal to the storage sub-circuit under the control of a scan signal. The storage sub-circuit 8 is electrically connected to the control terminal of the driving sub-circuit 1 and a first power terminal VDD, and is configured to store a data signal. The first light emitting control sub-circuit 51 is connected to the first power terminal VDD and the first terminal of the driving sub-circuit 1, and is configured to turn on or off conduction between the driving sub-circuit 1 and the first power terminal VDD. The second light emitting control sub-circuit 52 is connected to the second terminal of the driving sub-circuit 1 and a first electrode of the light emitting device OLED, and is configured to turn on or off conduction between the driving sub-circuit 1 and the light emitting device OLED. The second reset sub-circuit 4 is electrically connected to the first electrode of the light emitting device OLED and configured to reset the control terminal of the driving sub-circuit 1 and the first electrode of the light emitting device OLED under the control of a second reset control signal.

With continued reference to FIG. 2, the first reset sub-circuit includes a first transistor T11, the threshold compensation sub-circuit 8 includes a second transistor T12, the driving sub-circuit 1 includes a third transistor T13, the control terminal of the driving sub-circuit 1 includes a control electrode of the third transistor T13, the first terminal of the driving sub-circuit 1 includes a first electrode of the third transistor T13, and the second terminal of the driving sub-circuit 1 includes a second electrode of the third transistor T13. The data writing sub-circuit 14 includes a fourth transistor T14, the storage sub-circuit 6 includes a storage capacitor Cst, the first light emitting control sub-circuit 51 includes a fifth transistor T5, the second light emitting control sub-circuit 52 includes a sixth transistor T6, and the second reset sub-circuit 4 includes a seventh transistor T7.

It should be noted that, according to characteristics of a transistor, the transistors may be divided into N-type transistors and P-type transistors, and for the sake of clarity, the pixel driving circuit in FIG. 2 is described by taking the case, where the first transistor and the second transistor are N-type transistors (for example, oxide thin film transistors), and the third transistor, the fourth transistor, the fifth transistor, the sixth transistor, and the seventh transistor are P-type transistors (for example, low temperature poly-silicon thin film transistors), as an example.

In addition, the transistors used in the embodiments of the present disclosure may be thin film transistors or field effect transistors or other switching devices having the same characteristics. Each transistor includes a first electrode, a second electrode and a control electrode. The control electrode is a gate electrode of the transistor, one of the first electrode and the second electrode is a source electrode of the transistor, and the other one of the first electrode and the second electrode is a drain electrode of the transistor. The source electrode and the drain electrode of the transistor may be symmetrical in structure, so that the source electrode and the drain electrode of the transistor may have no difference in physical structure. In the embodiments of the present disclosure, in order to distinguish transistors, except a gate electrode serving as a control electrode, a first electrode is directly described as a source electrode, and a second electrode is directly described as a drain electrode, so that the source electrode and the drain electrode of all or part of the transistors in the embodiments of the present disclosure may be interchanged as necessary.

With continued reference to FIG. 2, a drain electrode of the fourth transistor T4 is electrically connected to a source electrode of the third transistor T3, a source electrode of the fourth transistor T4 is configured to be electrically connected to a data line Data to receive a Data signal, and a gate electrode of the fourth transistor T4 is configured to be electrically connected to a first scan signal line G1 to receive a scan signal. A second plate of the storage capacitor C is electrically connected to the first power terminal VDD, and a first plate of the storage capacitor C is electrically connected to a gate electrode of the third transistor T3. A source electrode of the second transistor T2 is electrically connected to a gate electrode of the third transistor T3, a drain electrode of the second transistor T2 is electrically connected to a drain electrode of the third transistor T3, and a gate electrode of the second transistor T2 is configured to be electrically connected to a second scan signal line G2 to receive a compensation control signal. A source electrode of the first transistor T1 is configured to be electrically connected to a first initial signal line Vinit1 to receive a first reset signal, a drain electrode of the first transistor T1 is electrically connected to the gate electrode of the third transistor T3, and a gate electrode of the first transistor T1 is configured to be electrically connected to a first reset signal terminal Re1 to receive a first reset control signal. A drain electrode of the seventh transistor T7 is configured to be electrically connected to the first initial signal line Vinit1 to receive the first reset signal, a source electrode of the seventh transistor T7 is electrically connected to the first electrode of the light emitting device OLED, and a gate electrode of the seventh transistor T7 is configured to be electrically connected to a second reset signal terminal Re2 to receive a second reset control signal. A source electrode of the fifth transistor T5 is electrically connected to the first power terminal VDD, a drain electrode of the fifth transistor T5 is electrically connected to the source electrode of the third transistor T3, and a gate electrode of the fifth transistor T5 is configured to be electrically connected to a first enable signal terminal EM1 to receive a first light emitting control signal. A source electrode of the sixth transistor T6 is electrically connected to the drain electrode of the third transistor T3, a drain electrode of the sixth transistor T6 is electrically connected to the first electrode of the light emitting device OLED, and a gate electrode of the sixth transistor T6 is configured to be electrically connected to a second enable signal terminal EM2 to receive a second light emitting control signal. A second electrode of the light emitting device OLED is electrically connected to a second power terminal VSS.

For example, one of a first power line VDD and a second power line VSS is a high voltage power line, and the other is a low voltage power line. For example, as shown in FIG. 2, the first power line VDD is a voltage source to output a constant first voltage, which is a positive voltage; and the second power line VSS may be a voltage source to output a constant second voltage, which a negative voltage. For example, in some examples, the second power terminal VSS may be grounded.

With continued reference to FIG. 2, the first light emitting control signal and the second light emitting control signal may be the same, i.e., the gate electrode of the fifth transistor T5 and the gate electrode of the sixth transistor T6 may be electrically connected to a same signal line, e.g., the first enable signal terminal EM1, to receive a same signal (e.g., the first light emitting control signal). In this case, the display panel may not be provided with the second enable signal terminal EM2, reducing the number of terminals. For another example, the gate electrode of the fifth transistor T5 and the gate electrode of the sixth transistor T6 may alternatively be electrically connected to different signal terminals, respectively, that is, the gate electrode of the fifth transistor T5 is electrically connected to the first enable signal terminal EM1, and the gate electrode of the sixth transistor T6 is electrically connected to the second enable signal terminal EM2, while the signals transmitted by the first enable signal terminal EM1 and the second enable signal terminal EM2 are the same.

It should be noted that, where the fifth transistor T5 and the sixth transistor T6 are different types of transistors, for example, the fifth transistor T5 is a P-type transistor, and the sixth transistor T6 is an N-type transistor, the first light emitting control signal and the second light emitting control signal may alternatively be different, which is not limited in the embodiments of the present disclosure. In an embodiment of the present disclosure, the gate electrode of each of the fifth transistor T5 and the sixth transistor T6 is connected to an enable signal terminal EM.

With continued reference to FIG. 2, since the switching characteristics of the first transistor and the seventh transistor are opposite to each other, the gates of the two transistors are electrically connected to different reset signal lines. In some examples, a reset signal line connected to the gate electrode of the first transistor in a present row is and a reset signal line connected to the gate of the seventh transistor in a previous row is may be multiplexed for reduction of wiring.

For example, the source electrode of the first transistor T1 and the drain electrode of the seventh transistor T7 are connected to a first initial signal line Vinit1 and a second initial signal line Vinit2, respectively, and the first initial signal line Vinit1 and the second initial signal line Vinit2 each may be a direct current reference voltage terminal to output a constant direct current reference voltage. The first initial signal line Vinit1 and the second initial signal line Vinit2 may be the same, for example, the source electrode of the first transistor T1 and the drain electrode of the seventh transistor T7 are connected to a same initial signal line. The first initial signal line Vinit1 and the second initial signal line Vinit2 may be a high voltage terminal or a low voltage terminal, as long as the first initial signal line Vinit1 and the second initial signal line Vinit2 can provide a first reset signal and a first reset signal to reset the gate electrode of the third transistor T3 and the first electrode of the light emitting element, respectively, which is not limited by the present disclosure. For example, the source electrode of the first transistor T1 and the drain electrode of the seventh transistor T7 may both be connected to a reset signal line Vinit.

In addition, the first reset sub-circuit 2, the threshold compensation sub-circuit 8, the driving sub-circuit 1, the data writing sub-circuit 7, the first light emitting control sub-circuit 51, the second light emitting control sub-circuit 52, the second reset sub-circuit 4, and the storage sub-circuit 8 in the pixel circuit shown in FIG. 2 are only schematic, and the specific structures of the sub-circuits such as the first reset sub-circuit 2, the threshold compensation sub-circuit 8, the driving sub-circuit 1, the data writing sub-circuit 7, the first light emitting control sub-circuit 51, the second light emitting control sub-circuit 52, the second reset sub-circuit 4, and the storage sub-circuit 8 may be set according to practical application requirements, which is not particularly limited in the embodiments of the present disclosure.

It should be noted that, in an embodiment of the present disclosure, in addition to the 7T1C (i.e., seven transistors and one capacitor) structure shown in FIG. 2, the pixel circuit of the sub-pixel may alternatively be a circuit structure including other number of transistors and capacitors, such as a 7T12C structure, a 6T1C structure, a 6T12C structure, or a 9T12C structure, which is not limited in the embodiments of the present disclosure.

The light emitting device in an embodiment of the present disclosure may be an Organic Light Emitting Diode (OLED). Alternatively, the light emitting device may be a micro inorganic light emitting diode, and further, may be a current type light emitting diode, such as a Micro Light Emitting Diode (Micro LED) or a Mini Light Emitting Diode (Mini LED). One of the first electrode and the second electrode of the light emitting device is an anode, and the other is a cathode. In an embodiment of the present disclosure, it is taken as an example that the first electrode of the light emitting device is an anode, and the second electrode is as a cathode, for description.

In a first aspect, as shown in FIGS. 3 to 16, an embodiment of the present disclosure provides a display panel, which includes a base substrate, a driving circuit layer arranged on the base substrate, and a light emitting structure layer arranged on a side of the driving circuit layer away from the base substrate. The driving circuit layer includes a pixel driving circuit and a plurality of initial signal lines. The light emitting structure layer includes a plurality of light emitting devices, and each pixel driving circuit may be electrically connected to one pixel driving circuit. The pixel driving circuit in an embodiment of the present disclosure may adopt the pixel driving circuit shown in FIG. 2. That is, the first transistor and the second transistor may both adopt N-type transistors, and both transistors are oxide thin film transistors, and the third transistor, the fourth transistor, the fifth transistor, the sixth transistor, and the seventh transistor all adopt P-type transistors, and all adopt low temperature poly-silicon thin film transistors. In particular, in an embodiment of the present disclosure, each of the plurality of initial signal lines in at least one circuit unit includes a signal sub-line extending in a first direction X, at least one of the plurality of initial signal lines in the at least one circuit unit includes a signal sub-line extending in a second direction Y, and for the initial signal line including the signal sub-lines in the two directions (the first direction X and the second direction Y), the signal sub-lines are electrically connected to each other. In order to clarify the structure of the display panel in the embodiment of the present disclosure, taking the display substrate including the above-described two initial signal lines as an example, one of the two initial signal lines is a first initial signal line, and the other of the two initial signal lines is a second initial signal line. For example, at least one of the first initial signal line and the second initial signal line in the at least one circuit unit includes a signal sub-line extending in a first direction X and a signal sub-line extending in a second direction Y, wherein the first direction X and the second direction Y are arranged to cross with each other. For example, the first initial signal line includes a first signal sub-line 31 extending in the first direction X and a second signal sub-line 73 extending in the second direction Y, and the first signal sub-line 31 and the second signal sub-line 73 crossing with each other are electrically connected to each other; and/or, the second initial signal line includes a third signal sub-line 61 extending in the first direction X and a fourth signal sub-line 74 extending in the second direction Y, and the third signal sub-line 61 and the fourth signal sub-line 74 crossing with each other are electrically connected to each other. In the following description, a description is given taking as an example that the first initial signal line includes the first signal sub-line 31 extending in the first direction X and the second signal sub-line 73, and the second initial signal line includes the third signal sub-line 61 extending in the first direction X and the fourth signal sub-line 74.

In some examples, a plurality of circuit units in the driving circuit layer are arranged side by side in the first direction X to form a unit row 10, and a plurality of unit rows 10 are arranged side by side in the second direction Y. The plurality of circuit units in the driving circuit layer are arranged side by side in the second direction Y to form a unit column 20, and a plurality of unit columns 20 are arranged side by side in the first direction X. The first signal sub-line 31 of the first initial signal line and the third signal sub-line 61 of the second initial signal line may be arranged in each unit row 10. In at least one unit column 20, the second signal sub-lines 73 of the first initial signal lines in the circuit units adjacent to each other are connected to each other, and the fourth signal sub-lines 74 of the second initial signal lines in the circuit units adjacent to each other are connected to each other. The second signal sub-lines 73 are provided in the unit columns 20 at intervals, and similarly, the fourth signal sub-lines 74 are also provided in the unit columns 20 at intervals. That is, at least one unit column 20 is present between two second signal sub-lines 73 adjacent to each other in the first direction X, and at least one unit column 20 is present between two fourth signal sub-lines 74 adjacent to each other in the first direction X.

Figure 4:
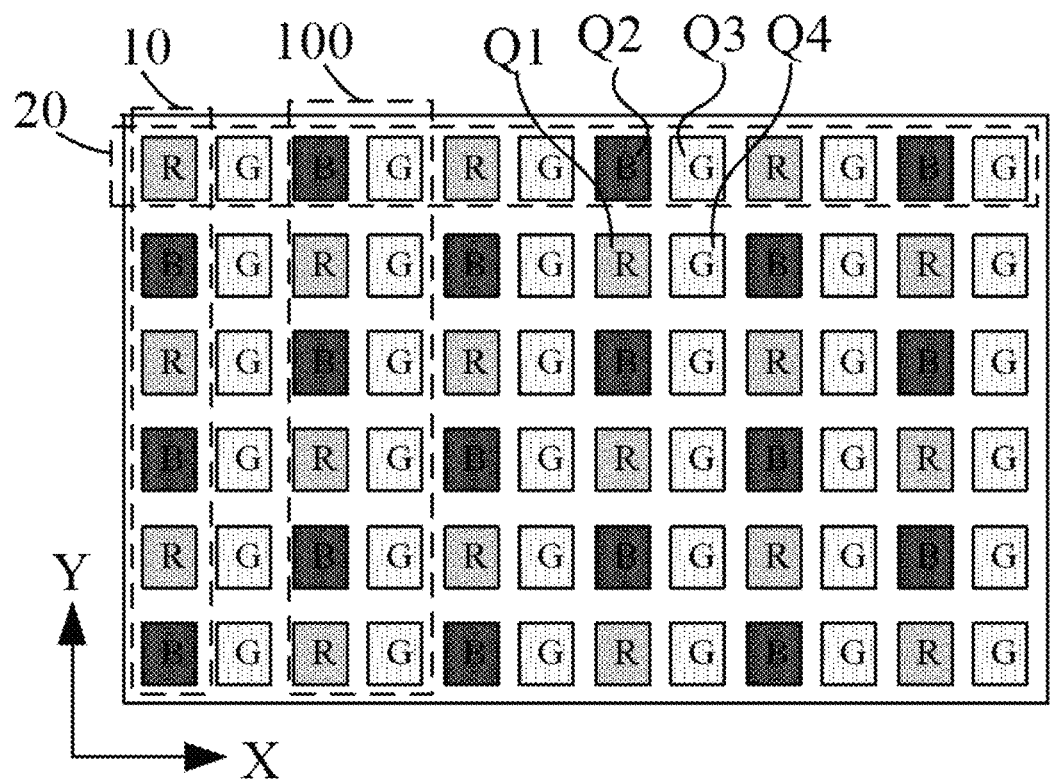
FIG. 4 is a schematic diagram illustrating a distribution of a display panel according to an embodiment of the present disclosure.

In some examples, as shown in FIG. 4, the plurality of sub-pixels in the display panel may include a red sub-pixel R emitting red light, a blue sub-pixel B emitting blue light, a first green sub-pixel G1 emitting green light, and a second green sub-pixel G2 emitting green light. The red sub-pixel R may include a red light emitting device emitting red light and a first circuit unit Q1 connected to the red light emitting device. The blue sub-pixel B may include a blue light emitting device emitting blue light and a second circuit unit Q2 connected to the blue light emitting device. The first green sub-pixel G1 may include a first green light emitting device emitting green light and a third circuit unit Q3 connected to the first green light emitting device. The second green sub-pixel G2 may include a second green light emitting device emitting green light and a fourth circuit unit Q4 connected to the second green light emitting device. The first circuit unit Q1, the second circuit unit Q2, the third circuit unit Q3 and the fourth circuit unit Q4 form one circuit unit group. The four circuit units in at least one circuit unit group may be arranged in a Square manner, i.e., four circuit units are arranged in two unit rows 10 and two unit columns 20. The sub-pixels in the present disclosure refer to regions divided according to the light emitting devices, and the circuit units in the present disclosure refer to regions divided according to the pixel driving circuits. In an exemplary embodiment, the positions of the sub-pixels and the circuit units may be corresponding to each other, alternatively, the positions of the sub-pixels and the circuit units may be non-corresponding to each other.

In some examples, the plurality of unit columns 20 may include a first unit column 20 and a second unit column 20, wherein the first unit column 20 refers to a column formed of a plurality of first circuit units Q1 and a plurality of second circuit units Q2, and the second unit column 20 refers to a column formed of a plurality of third circuit units Q3 and a plurality of fourth circuit units Q4. The first circuit units Q1 and the second circuit units Q2 in the first unit column 20 are alternately arranged in the second direction Y, and the third circuit units Q3 and the fourth circuit units Q4 in the second unit column 20 are alternately arranged in the second direction Y.

In one example, the second signal sub-line of the first initial signal line and the fourth signal sub-line 74 of the second initial signal line may be arranged in the first unit column 20. For example, the $N^{th}$ unit column 20 and the $(N+2)^{th}$ unit column 20 each may be the first unit column 20, and the $(N+1)^{th}$ unit column 20 and the $(N+3)^{th}$ unit column 20 each may be the second unit column 20, and the second initial signal line 52 may be arranged in the $N^{th}$ unit column 20, the $(N+2)^{th}$ unit column 20, the $(N+4)^{th}$ unit column 20, . . . , and the second initial signal line 52 may be repeated every other second unit column 20.

In another example, the second signal sub-line of the first initial signal line and the fourth signal sub-line 74 of the second initial signal line may be arranged in the second unit column 20. For example, the $N^{th}$ unit column 20 and the $(N+2)^{th}$ unit column 20 each may be the first unit column 20, and the $(N+1)^{th}$ unit column 20 and the $(N+3)^{th}$ unit column 20 may be the second unit column 20, and then the second initial signal line 52 may be arranged at the $(N+1)^{th}$ unit column 20, the $(N+3)^{th}$ unit column 20, the $(N+5)^{th}$ unit column 20, . . . , and the second initial signal line 52 may be repeated every other first unit column 20.

In another example, the second signal sub-line of the first initial signal line and the fourth signal sub-line 74 of the second initial signal line may be arranged in the first unit column 20 and the second unit column 20.

In some examples, the $N^{th}$ unit column 20 and the $(N+2)^{th}$ unit column 20 each may be the first unit column 20, and the $(N+1)^{th}$ unit column 20 and the $(N+3)^{th}$ unit column 20 each may be the second unit column 20. In the $N^{th}$ unit column 20, the circuit unit in the $M^{th}$ row is a first circuit unit, and the circuit unit in the $(M+1)^{th}$ row is a second circuit unit, so that the first circuit units and the second circuit units in the $N^{th}$ unit column 20 are alternately arranged in the second direction Y. In the $(N+2)^{th}$ unit column 20, the circuit unit of the $M^{th}$ row is the second circuit unit, and the circuit unit of the $(M+1)^{th}$ row is the first circuit unit, so that the second circuit units and the first circuit units in the $(N+2)^{th}$ unit column 20 are alternately arranged in the second direction Y.

In some examples, since the circuit unit in the $M^{th}$ row and $N^{th}$ column and the circuit unit in the $(M+1)^{th}$ row and $(N+2)^{th}$ column are both the first circuit units, the first signal sub-line 31 of the first initial signal line in the circuit unit in the $M^{th}$ row and $N^{th}$ column may have a same shape as the first signal sub-line 31 of the first initial signal line in the circuit unit in the $(M+1)^{th}$ row and $(N+2)^{th}$ column, and the fourth signal sub-line 74 of the second initial signal line in the circuit unit in the $M^{th}$ row and $N^{th}$ column may have a same shape as the fourth signal sub-line 74 of the second initial signal line in the circuit unit in the $(M+1)^{th}$ row and $(N+2)^{th}$ column. Since the circuit unit in the $(M+1)^{th}$ row and $N^{th}$ column and the circuit unit in the $M^{th}$ row and $(N+2)^{th}$ column are both the second circuit units, the second initial signal line in the circuit unit in the $(M+1)^{th}$ row and $N^{th}$ column may have a same shape as the first signal sub-line 31 of the first initial signal line in the circuit unit of the $M^{th}$ row and $(N+2)^{th}$ column, and the second initial signal line in the circuit unit in the $(M+1)^{th}$ row and $N^{th}$ column may have a same shape as the fourth signal sub-line 74 of the second initial signal line in the circuit unit in the $M^{th}$ row and $(N+2)^{th}$ column.

In some possible exemplary embodiments, the second signal sub-lines 73 of the first initial signal lines may be arranged in the first unit columns 20 or the second unit columns 20 with one first unit column 20 or one second unit column 20 therebetween, i.e., between two second signal sub-lines 73 adjacent to each other in the first direction X, there are three unit columns 20 in the interval. For example, the second signal sub-lines 73 may be arranged in the $N^{th}$ unit column 20, the $(N+4)^{th}$ unit column 20, and the $(N+8)^{th}$ unit column 20, . . . , the second signal sub-lines 73 being repeated every one first unit column 20 and two second unit columns 20. Alternatively, the second signal sub-lines 73 may be arranged in the $(N+1)^{th}$ unit column 20, the $(N+5)^{th}$ unit column 20, and the $(N+9)^{th}$ unit column 20, . . . , the second signal sub-lines 73 being repeated every two first unit columns 20 and one second unit column 20. In an exemplary embodiment, the number of the unit columns 20 present between two second signal sub-lines 73 adjacent to each other is not particularly required, and may be set according to needs, which is not limited by the present disclosure herein. The arrangement of the fourth signal sub-lines 74 of the second initial signal lines is the same as the arrangement of the second signal sub-lines 73 of the first initial signal lines, and therefore, the description thereof is omitted.

Figure 7:
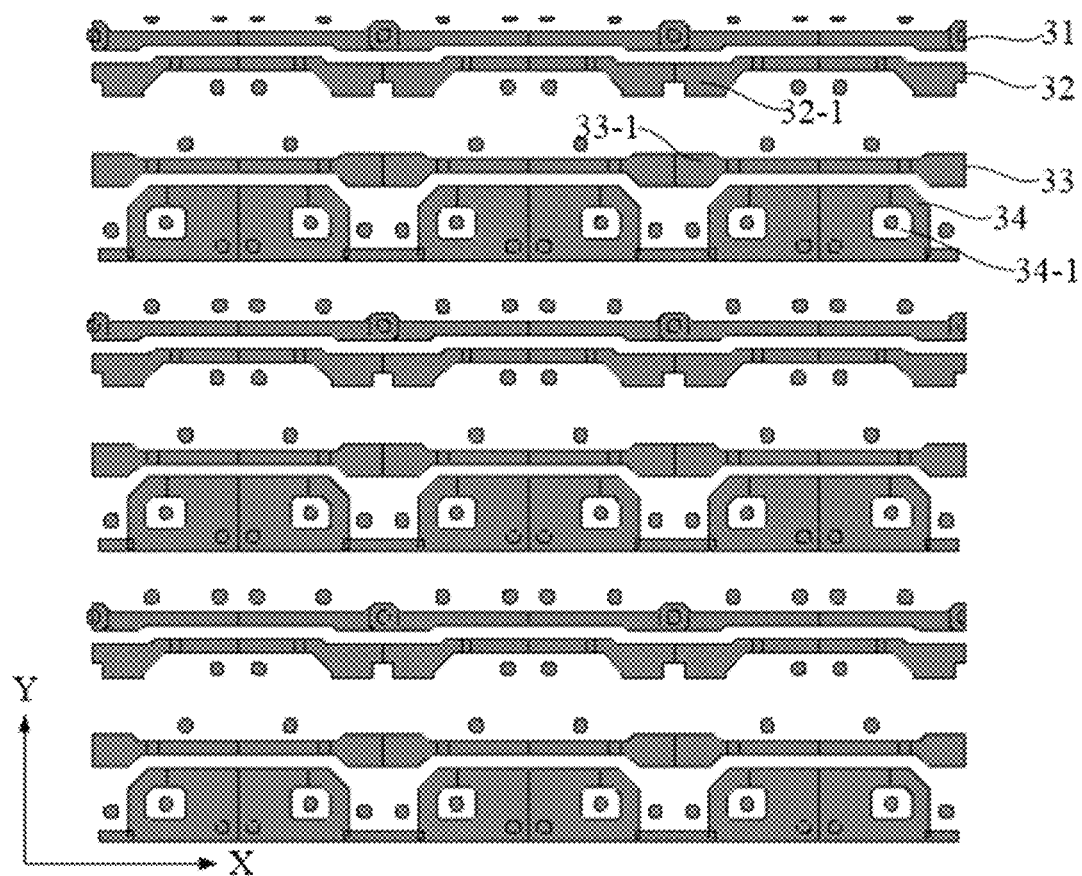
FIG. 7 is a layout of a second conductive layer of the display panel according to an embodiment of the present disclosure.

In some examples, as shown in FIG. 7, the circuit unit of the display panel includes not only the above-described structure but also a first power line 71 and a data line 72, wherein the first power line 71 is configured as a signal line that receives a power signal, and the data line 72 is configured as a signal line that receives a data voltage signal. In at least one unit column 20, first power lines 71 in circuit units adjacent to each other are connected to each other, and data lines 72 in circuit units adjacent to each other are connected to each other. The first power line 71 includes a first side (left side) and a second side (right side) oppositely arranged in the first direction X, the data line 72 in one of two unit columns 20 adjacent to each other is located on the first side of the first power line 71 in the one of two unit columns 20 adjacent to each other, and the data line 72 in the other of two unit columns 20 adjacent to each other is located on the second side of the first power line 71 in the other of two unit columns 20 adjacent to each other. Alternatively, the data line 72 in one of two unit columns 20 adjacent to each other is located on the second side of the first power line 71 in the one of two unit columns 20 adjacent to each other, and the data line 72 in the other of two unit columns 20 adjacent to each other is located on the first side of the first power line 71 in the other of two unit columns 20 adjacent to each other. Meanwhile, in the unit column 20, the second signal sub-line 73 of the first initial signal line and the fourth signal sub-line 74 of the second initial signal line are located on a same side of the first power line 71 in the first direction X, and on a different side of the first power line 71 in the first direction X from the data line 72. That is, in the unit column 20, the second signal sub-line 73 and the fourth signal sub-line 74 are located on the first side of the first power line 71, and the data line 72 is located on the second side of the first power line 71. Alternatively, the second signal sub-line 73 and the fourth signal sub-line 74 are located on the second side of the first power line 71, and the data line 72 is located on the first side of the first power line 71.

In some examples, two data lines 72 are arranged between the first power line 71 in the $N^{th}$ unit column 20 and the first power line 71 in the $(N+1)^{th}$ unit column 20 (one of the data lines 72 is in the $N^{th}$ unit column 20 and the other is in the $(N+1)^{th}$ unit column 20), and a second signal sub-line 73 and a fourth signal sub-line 74 (in the $(N+1)^{th}$ unit column 20) are arranged between the first power line 71 in the $(N+1)^{th}$ unit column 20 and the first power line 71 in the $(N+2)^{th}$ unit column 20.

In some examples, the driving circuit layer includes a plurality of unit structures 100 arranged side by side in the first direction X. Each unit structure 100 includes two unit columns 20 adjacent to each other. For example, each unit structure 100 includes a first unit column 20 and a second unit column 20 which are adjacent to each other. In some examples, the first power lines 71 in two unit columns 20 adjacent to each other in the first direction X are arranged in mirror symmetry with respect to a symmetry axis in the second direction Y. That is, two first power lines 71 in each unit structure 100 are arranged in mirror symmetry. The first power line 71 in the circuit unit includes a first line segment 71-1 and a second line segment 71-2 extending in the second direction Y and electrically connected to each other. In the unit column 20, the first line segment 71-1 of the first power line 71 in one of two circuit units adjacent to each other is electrically connected to the second line segment 71-2 of the first power line 71 in the other of two circuit units adjacent to each other. In the unit structure 100, a distance between the second line segments 71-2 adjacent to each other in the first direction X is less than a distance between the first line segments 71-1 adjacent to each other in the first direction X. In each unit structure 100, the second line segments 71-2 adjacent to each other in the first direction X are shorted, and in this case, a respective first power line 71 forms a structure similar to a conductive mesh, so that the resistance can be reduced.

In addition, it should be noted that the first line segment 71-1 and the second line segment 71-2 of the first power line 71 in each circuit unit are electrically connected through a connecting line segment 71-3. An extending direction of the connecting line segment 71-3 forms an included angle less than 90° with the second direction Y. For example, the included angle is 30°, 45°, 60° or the like. Line widths of the first line segment 71-1, the second line segment 71-2 and the connecting line segment 71-3 of the first power line 71 may be the same as or different from each other. In some examples, the line width of the first line segment 71-1 is greater than the line widths of the second line segment 71-2 and the connecting line segment 71-3.

In some examples, as shown in FIGS. 5 to 13, the driving circuit layer may include a first semiconductor layer, a first conductive layer, a second conductive layer, a second semiconductor layer, a third conductive layer, a fourth conductive layer, and a fifth conductive layer sequentially arranged in a direction away from the base substrate in a plane perpendicular to the display panel. The first semiconductor layer includes the gate electrode of the third transistor, the gate electrode of the fourth transistor, the gate electrode of the fifth transistor, the gate electrode of the sixth transistor and the gate electrode of the seventh transistor in the pixel driving circuit. The first conductive layer includes a first scan line 21, a light emitting control line 23, and the first plate 22 of the storage capacitor in the pixel driving circuit. The second conductive layer includes a first gate electrode of the first transistor, a first gate electrode of the second transistor, and the second plate 34 of the storage capacitor, a first part 33 of a second scan line, a first part 32 of a first reset signal line, and the first signal sub-line 31 in the pixel driving circuit. The second semiconductor layer includes an active layer 41 of the first transistor and an active layer 42 of the second transistor in the pixel driving circuit. The third conductive layer includes a second gate electrode of the first transistor and a second gate electrode of the second transistor, a second part 52 of the second scan line, a second part 51 of the first reset signal line in the pixel driving circuit. The fourth conductive layer includes the third signal sub-line 61. The fifth conductive layer includes the second signal sub-line 73 of the first initial signal line and the fourth signal sub-line 74 of the second initial signal line.

Figure 11:
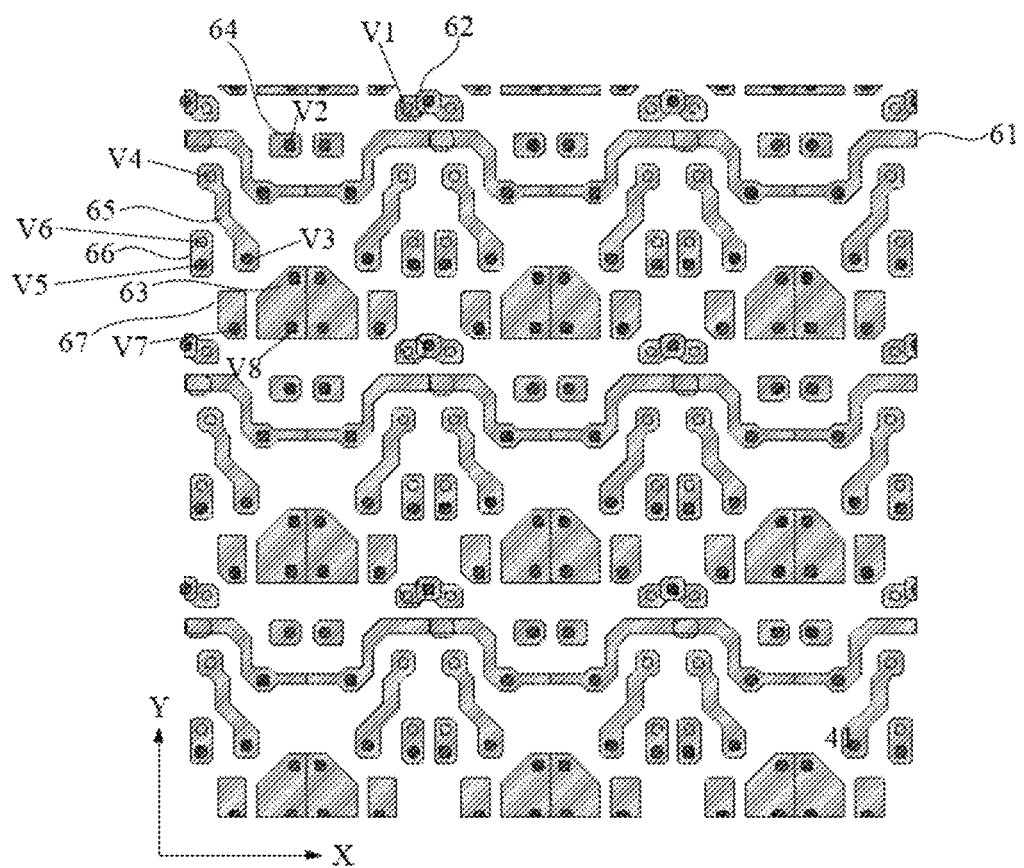
FIG. 11 is a layout of a fourth conductive layer of the display panel according to an embodiment of the present disclosure.

In some examples, as shown in FIG. 11, the fourth conductive layer may include not only the above-described structure but also a plurality of first connecting electrodes 62. The first signal sub-line 31 of the first initial signal line is electrically connected to a first region (source electrode) of the active layer 41 of the first transistor through a via. The first region of the active layer 41 of the first transistor is electrically connected to the first connecting electrode 62 through a via. The first connecting electrode 62 is electrically connected to the second signal sub-line 73 through a via.

Figure 12:
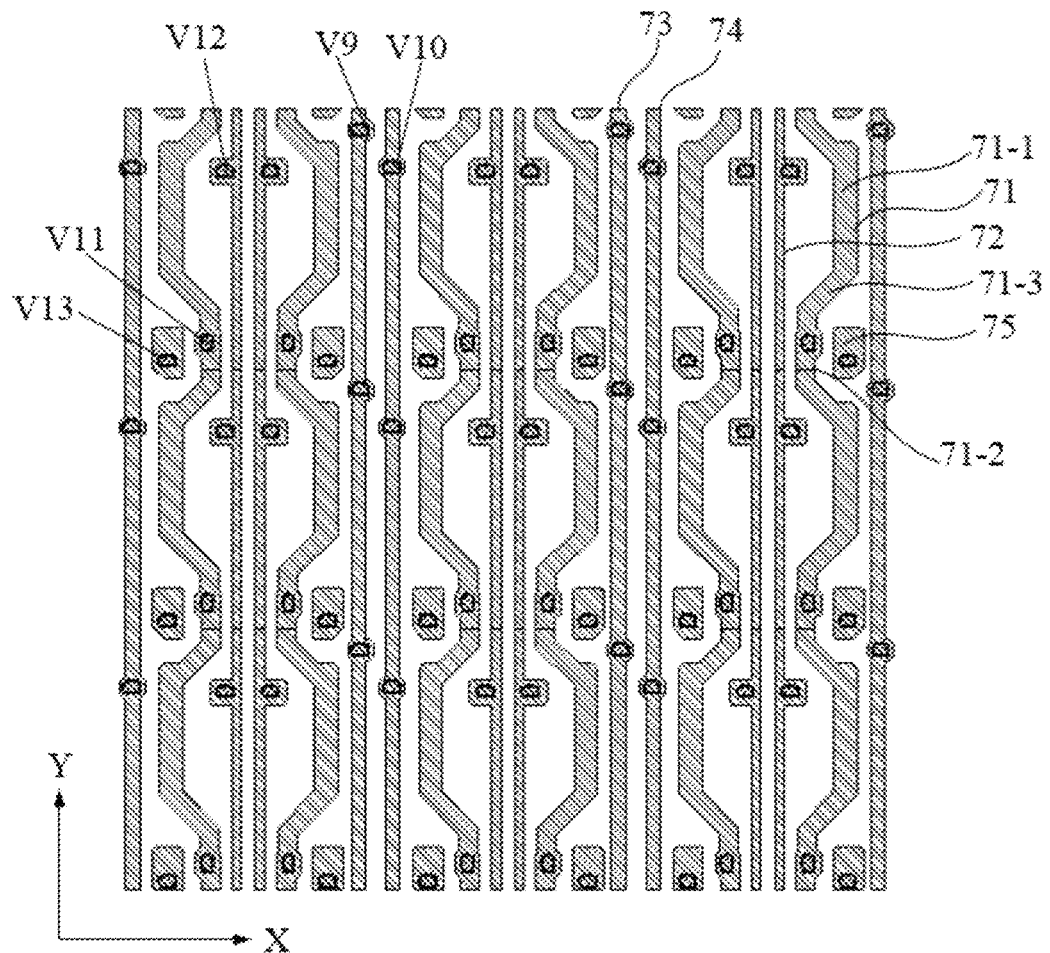
FIG. 12 is a layout of a fifth conductive layer of the display panel according to an embodiment of the present disclosure.
Figure 13:
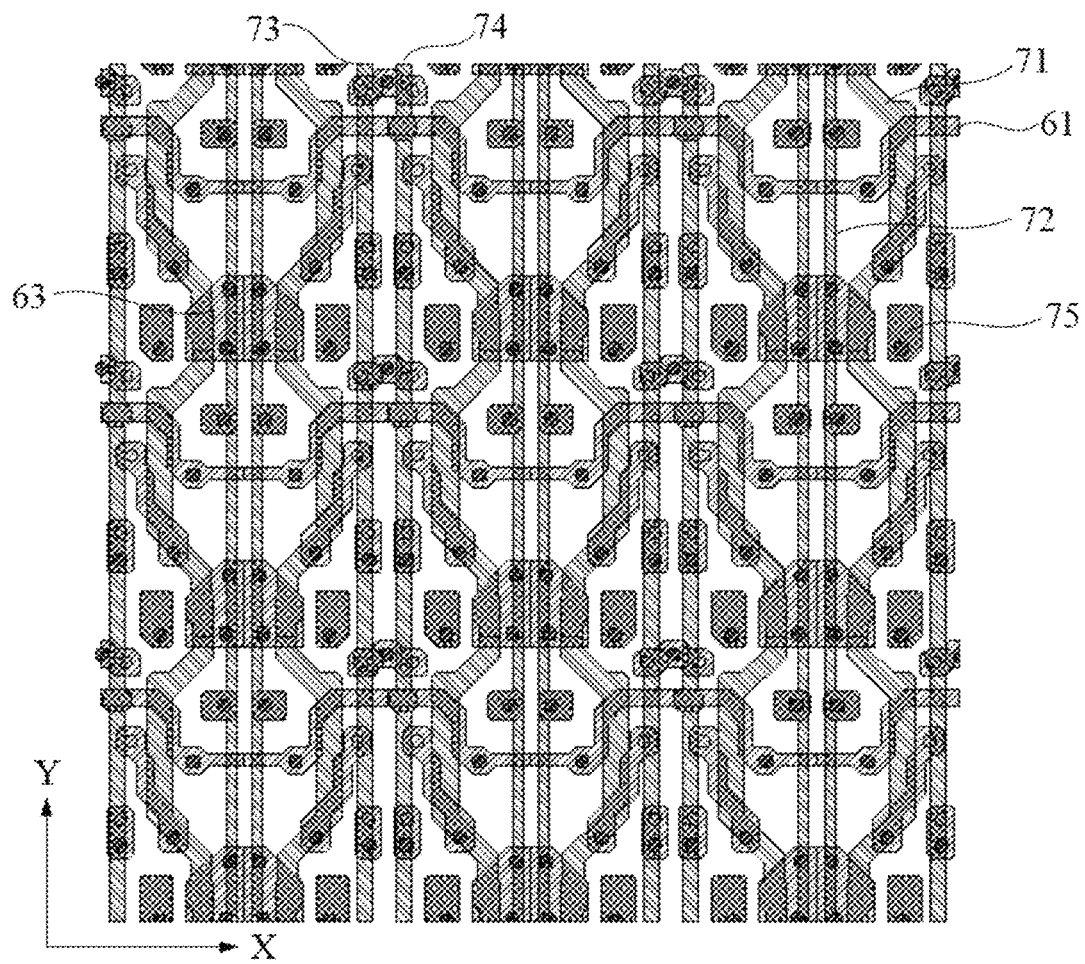
FIG. 13 is a layout of the fourth conductive layer and the fifth conductive layer, which are stacked together, of the display panel according to an embodiment of the present disclosure.

In some examples, as shown in FIGS. 12 and 13, the fifth conductive layer includes the first power line 71, and the fourth conductive layer further includes a plurality of second connecting electrodes 63 in each of the unit structures 100. In the unit structure 100, one of the second connecting electrodes 63 electrically connects second line segments 71-2 of the first power lines 71 adjacent to each other in the first direction X together through vias. As shown in FIG. X, the second connecting electrode 63 includes two chamfers, which are provided to reserve space for other structures. A shape of the second connecting electrode 63 may be changed, and for example, a circle, a regular polygon, or the like may be adopted.

In some examples, as shown in FIGS. 12 and 13, the fifth conductive layer further includes the data line 72, and the fourth conductive layer further includes a plurality of third connecting electrodes 64. In each circuit unit, a first region (source electrode) of the active layer 12 of the fourth transistor in the pixel driving circuit is connected to the third connecting electrode 64 through a via. The third connecting electrode 64 is connected to the data line 72 through a via.

In some examples, as shown in FIG. 11, the fourth conductive layer further includes a plurality of fourth connecting electrodes 65. In each circuit unit, the fourth connecting electrode 65 is connected to the gate electrode of the third transistor in the pixel driving circuit through a via. A second region (drain electrode) of the active layer 41 of the first transistor and a first region (source electrode) of the second transistor in the pixel driving circuit are electrically connected to the fourth connecting electrode 65 through a via. For example, an extending direction of the fourth connecting electrode 65 has a certain included angle with the second direction Y, and the fourth connecting electrode 65 has a first end and a second end that are oppositely arranged in the extending direction thereof. The first end of the fourth connecting electrode 65 is connected to the gate electrode of the third transistor through a via, and the second end of the fourth connecting electrode 65 is connected to the second region of the active layer 41 of the first transistor and the first region of the second transistor through a via.

Figure 14:
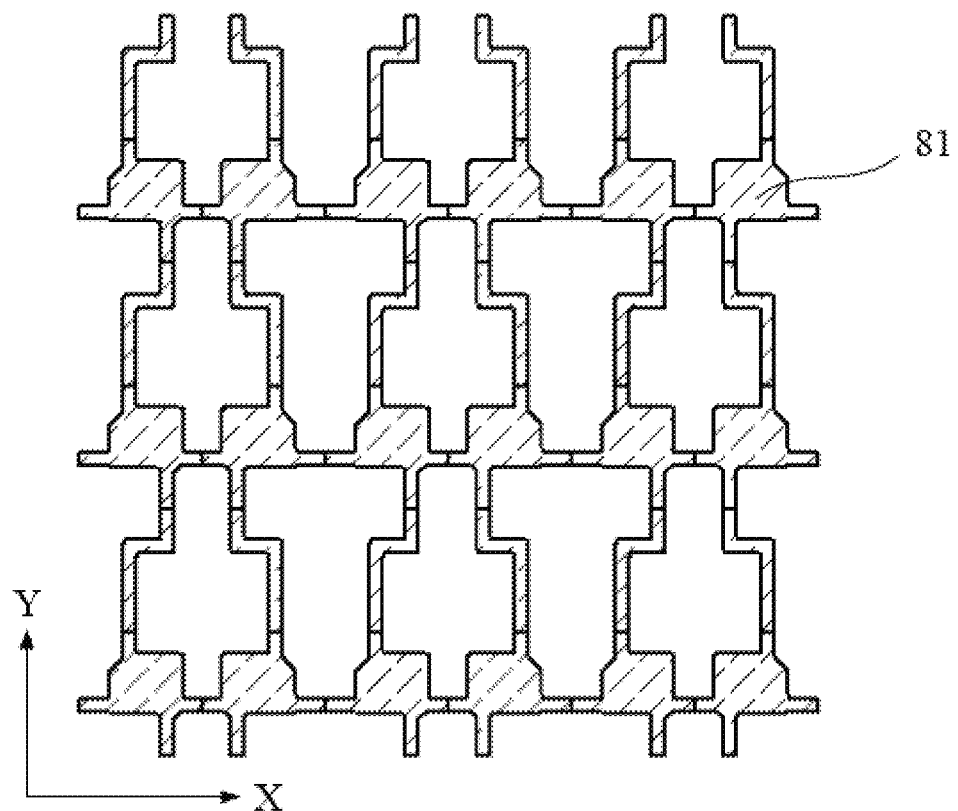
FIG. 14 is a layout of a shielding electrode layer of the display panel according to an embodiment of the present disclosure.

In some examples, as shown in FIG. 11, the fourth conductive layer further includes a plurality of fifth connecting electrodes 66. In each circuit unit, the fifth connecting electrode 66 is electrically connected to a second region (drain electrode) of the active layer of the third transistor in the pixel driving circuit through a via, and the second region (drain electrode) of the active layer 42 of the second transistor in the pixel driving circuit is electrically connected to the fifth connecting electrodes 66 through a via. In some examples, as shown in FIGS. 11 to 13, the fourth conductive layer further includes sixth connecting electrodes 67, the fifth conductive layer further includes seventh connecting electrodes 75. In each circuit unit, the sixth connecting electrode 67 is electrically connected to a second region (drain electrode) of the active layer 14 of the sixth transistor through a via. The sixth connecting electrode 67 is electrically connected to the seventh connecting electrode 75 through a via. An anode of the light emitting device is electrically connected to the seventh connecting electrode 75 through a via. In some examples, as shown in FIG. 14, the driving circuit layer may further include a shielding electrode layer on a side of the first semiconductor layer close to the base substrate. The shielding electrode layer includes a plurality of shielding electrodes 81. An orthographic projection of the shielding electrode 81 on the base substrate covers an orthographic projection of the active layer 11 of the third transistor in the pixel driving circuit on the base substrate. In some examples, the shielding electrodes 81 arranged side by side in the first direction X are electrically connected to each other; and the shielding electrodes 81 arranged side by side in the second direction Y are electrically connected to each other. In some examples, the shielding electrode layer is electrically connected to the first power line 71 through a via. Alternatively, the shielding electrode layer may alternatively be electrically connected to the second power line, or connected to the first initial signal line (or the second initial signal line), or the shielding electrode layer is in a floating state, which are all within the protection scope of the embodiments of the present disclosure.

In some examples, the driving circuit layer may further include a first insulating layer, a second insulating layer, a third insulating layer, a fourth insulating layer, a fifth insulating layer, a sixth insulating layer, and a seventh insulating layer. The first insulating layer is arranged between the base substrate and the shielding electrode layer. The second insulating layer is arranged between the first semiconductor layer and the first conductive layer. The third insulating layer is arranged between the first conductive layer and the second conductive layer. The fourth insulating layer is arranged between the second conductive layer and the second semiconductor layer. The fifth insulating layer is arranged between the second semiconductor layer and the third conductive layer. The sixth insulating layer is arranged between the fourth conductive layer and the third conductive layer. The seventh insulating layer is arranged between the fourth conductive layer and the fifth conductive layer. The following is an exemplary description through a process of manufacturing a display panel. The "patterning process" in the present disclosure includes processes of coating a photoresist, exposing with a mask, developing, etching, and stripping a photoresist for a metal material, an inorganic material, or a transparent conductive material, and includes processes of coating an organic material, exposing with a mask, and developing for an organic material. A deposition may be any one or more of sputtering, evaporation, and chemical vapor deposition, the coating may be any one or more of spray coating, spin coating, and inkjet printing, and the etching may be any one or more of dry etching and wet etching, which are not limited in this disclosure. "Thin film" refers to a layer of a material deposited, coated, or otherwise formed on a base substrate. The "thin film" may alternatively be referred to as a "layer" if it does not require a patterning process throughout the fabrication process. If the "thin film" requires a patterning process during the entire fabrication process, the "thin film" is referred to as "thin film" before the patterning process, and is referred to as "layer" after the patterning process. The "layer" after the patterning process includes at least one "pattern". The term "A and B are arranged in a same layer" in the present disclosure means that A and B are formed simultaneously by a same patterning process, and a "thickness" of the film layer is a dimension of the film layer in a direction perpendicular to the display panel. In the exemplary embodiments of the present disclosure, the term "an orthographic projection of B is within an orthographic projection of A" or "an orthographic projection of A includes an orthographic projection of B" means that a boundary of the orthographic projection of B falls within a boundary of the orthographic projection of A, or the boundary of the orthographic projection of A overlaps the boundary of the orthographic projection of B.

The manufacturing process of the driving circuit layer in an embodiment of the present disclosure may include the following operations.

(1) A pattern of the shielding electrode layer is formed. In some examples, forming the pattern of the shielding electrode layer may include depositing a thin film of shielding electrode 81 material on the base substrate, and patterning the thin film of shielding electrode 81 material through a patterning process, to form the shielding electrode layer, as shown in FIG. 14.

In some examples, the plurality of shielding electrodes 81 of the shielding electrode layer each may be of a block structure, for example, a square block, a circular block, a regular polygonal block, or the like. The shape of the shielding electrode 81 is not limited in the embodiments of the present disclosure, as long as an orthographic projection of the shielding electrode 81 on the base substrate may cover an orthographic projection of the subsequently formed active layer 11 of the third transistor in the pixel driving circuit on the base substrate.

Figure 5:
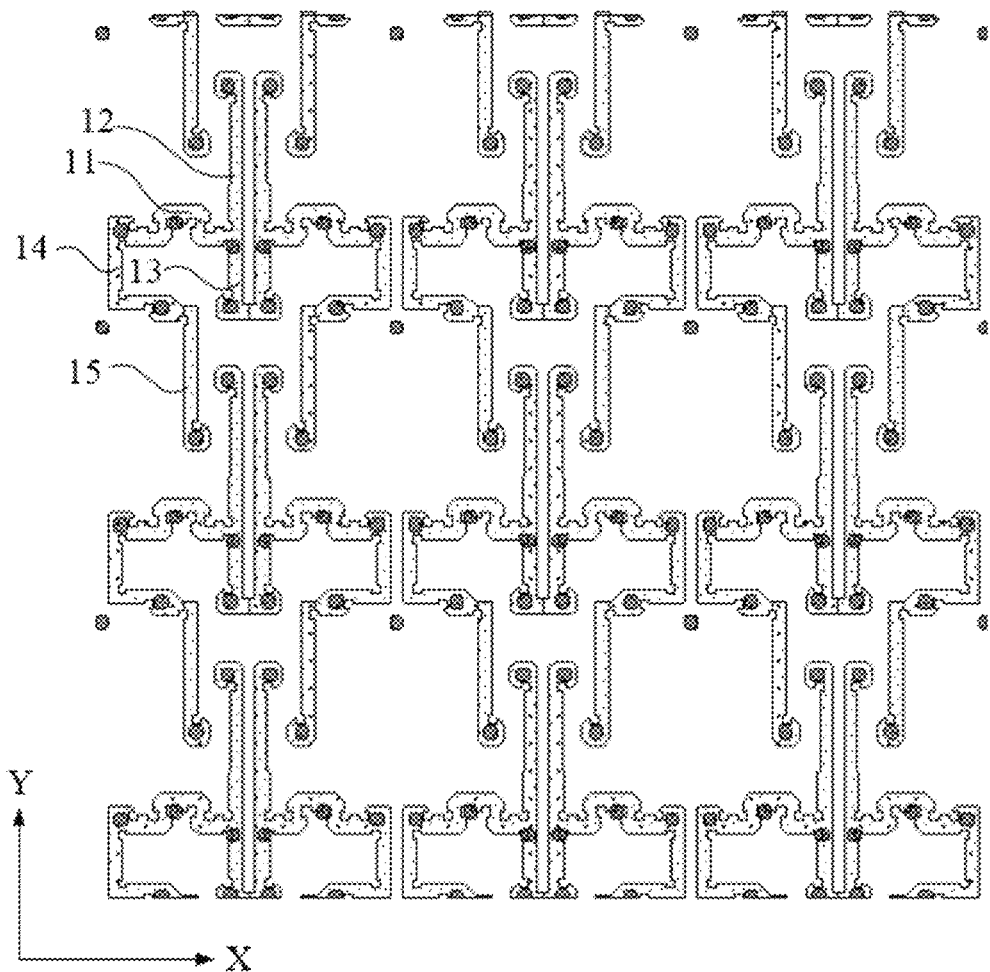
FIG. 5 is a layout of a first semiconductor layer of the display panel according to an embodiment of the present disclosure.

(2) A pattern of the first semiconductor is formed. In some examples, forming the pattern of the first semiconductor may include sequentially depositing a first insulating film and a first semiconductor film on the base substrate with the above-described pattern, patterning the first semiconductor film through a patterning process, forming a first insulating layer covering the base substrate, and a first semiconductor layer arranged on the first insulating layer, as shown in FIG. 5.

In some examples, the first semiconductor layer in each circuit unit may include the active layer 11 of the third transistor, the active layer of the fourth transistor, the active layer of the fifth transistor, the active layer of the sixth transistor, and the active layer 15 of the seventh transistor, and the active layer 11 of the third transistor, the active layer of the fourth transistor, the active layer of the fifth transistor, the active layer of the sixth transistor, and the active layer 15 of the seventh transistor have a one-piece structure.

In some examples, the active layer 12 of the fourth transistor in the circuit unit in the $M^{th}$ row is located on a side of the active layer 11 of the third transistor in this circuit unit away from the circuit unit in the $(M+1)^{th}$ row, the active layer 13 of the fifth transistor, the active layer 14 of the sixth transistor, and the active layer 15 of the seventh transistor in the circuit unit in the $M^{th}$ row are located on a side of the active layer 11 of the third transistor in this circuit unit close to the circuit unit in the $(M+1)^{th}$ row; and the active layer 15 of the seventh transistor is located on a side of the active layer 13 of the fifth transistor and the active layer 14 of the sixth transistor away from the active layer 11 of the third transistor.

In some examples, the active layer 11 of the third transistor may have a shape of "x", the active layer 12 of the fourth transistor and the active layer 13 of the fifth transistor each may have a shape of "1", the active layer 14 of the sixth transistor may have a shape of "L", and the active layer 15 of the seventh transistor may have a shape of "7".

In some examples, the active layer of each transistor may include a first region, a second region, and a channel region between the first region and the second region. The first region of the active layer 11 of the third transistor also serves as both the second region of the active layer 12 of the fourth transistor and the second region of the active layer 13 of the fifth transistor, the second region of the active layer 11 of the third transistor also serves as the first region of the active layer 14 of the sixth transistor, and the second region of the active layer 14 of the sixth transistor also serves as the second region of the active layer 15 of the seventh transistor. In some examples, the first region of the active layer 12 of the fourth transistor and the first region of the active layer 13 of the fifth transistor are separate from each other.

Figure 6:
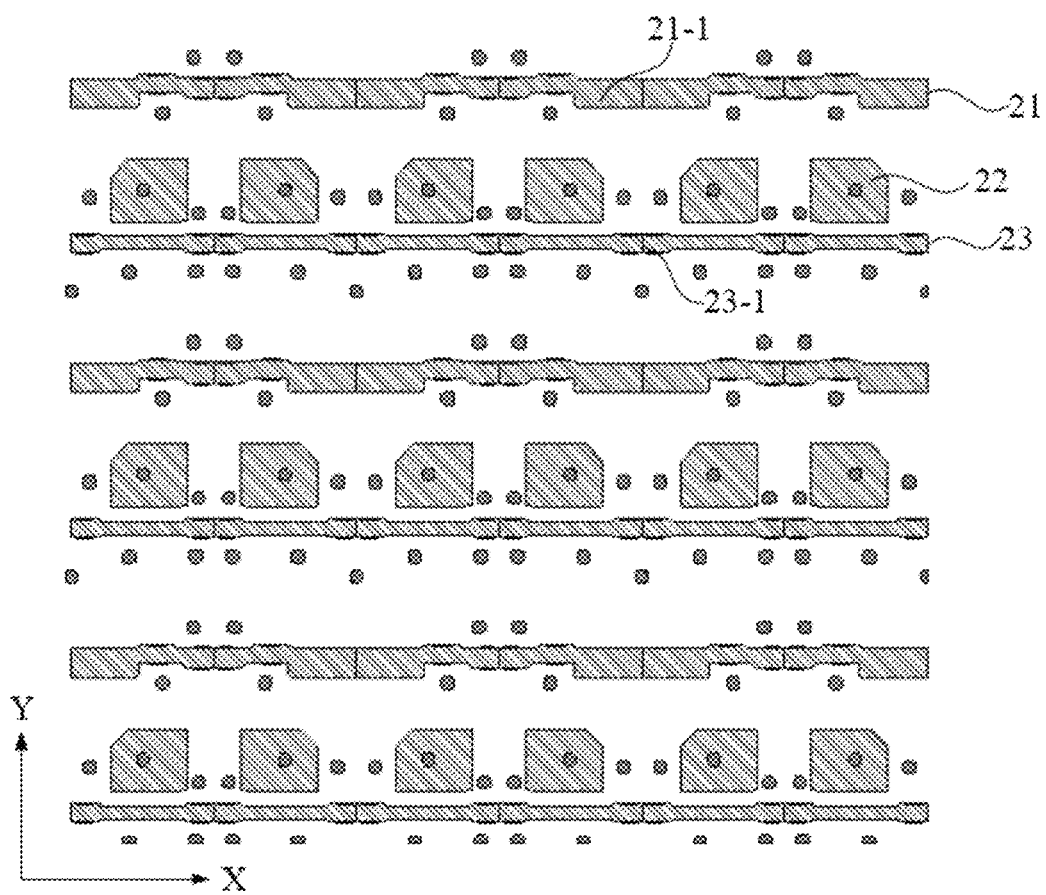
FIG. 6 is a layout of a first conductive layer of the display panel according to an embodiment of the present disclosure.

(3) A pattern of the first conductive layer is formed. In some examples, forming the pattern of the first conductive layer may include sequentially depositing a second insulating film and a first conductive film on the base substrate with the above-described patterns, patterning the first conductive film through a patterning process to form a second insulating layer covering the pattern of the semiconductor layer and the pattern of the first conductive layer arranged on the second insulating layer. The pattern of the first conductive layer at least includes the first scan line 21, the light emitting control line 23, and the first plate 22 of the storage capacitor, as shown in FIG. 6.

As shown in FIG. X, the first scan line 21 and the light emitting control line 23 extend in the first direction X. The first scan line 21 in the circuit unit in the $M^{th}$ row is located on a side of the first plate 22 of the storage capacitor in the circuit unit in this row away from the circuit unit in the $(M+1)^{th}$ row, and the light emitting control line 23 in the circuit unit in the $M^{th}$ row may be located on a side of the first plate 22 in this circuit unit close to the circuit unit in the $(M+1)^{th}$ row.

In some examples, the first plate 22 of the storage capacitor may have a rectangular shape, corners of the rectangular shape may be chamfered, and an orthographic projection of the first plate 22 on the base substrate and an orthographic projection of the active layer 11 of the third transistor on the base substrate have an overlapping region. In an exemplary embodiment, the first plate 22 may serve as both one plate of the storage capacitor and an electrode of the third transistor. A region 21-1 where the first scan line 21 overlaps the active layer 12 of the fourth transistor serves as the gate electrode of the fourth transistor. A region 23-1 where the light emitting control line 23 overlaps the active layer 13 of the fifth transistor serves as the gate electrode of the fifth transistor, and a region where the light emitting control line 23 overlaps the active layer 14 of the sixth transistor serves as the gate electrode of the sixth transistor.

(4) A pattern of the second conductive layer is formed. In some examples, forming the pattern of the second conductive layer may include sequentially depositing a third insulating film and a second conductive film on the base substrate with the above-described patterns, patterning the second conductive film through a patterning process, to form a third insulating layer covering the first conductive layer and a pattern of the second conductive layer arranged on the third insulating layer. The pattern of the second conductive layer at least includes the first signal sub-line 31 of the first initial signal line, the first part 32 of the reset signal line, the first part 33 of the second scan line, the second plate 34 of the storage capacitor, and a plate connecting line, as shown in FIG. 7.

As shown in FIG. X, the first signal sub-line 31, the first part 32 of the reset signal line, and the first part 33 of the second scan line extend in the first direction X. The first signal sub-line 31, the first part 33 of the second scan line, and the first part 32 of the reset signal line in the circuit unit in the $M^{th}$ row are all located on a side of the second plate 34 of the storage capacitor in the circuit unit in this row away from the circuit unit in the $(M+1)^{th}$ row, the first signal sub-line 31 and the first part 32 of the reset signal line in the circuit unit in this row are both located on a side of the first part 33 of the second scan line in the circuit unit in this row away from the second plate 34 of the storage capacitor, and the reset signal line is located between the first signal sub-line 31 and the first part 33 of the second scan line.

In some examples, the second plate 34 may have a rectangular shape, corners of the rectangular shape may be chamfered. An orthographic projection of the second plate 34 on the base substrate may overlap an orthographic projection of the first plate 22 on the base substrate, and the first plate 22 and the second plate 34 form the storage capacitor in the pixel driving circuit. The second plate 34 is provided with an opening 34-1, and the opening 34-1 may be located in the middle of the second plate 34. The opening may be rectangular such that the second plate 34 forms a ring-shaped structure. The opening 34-1 exposes the third insulating layer covering the first plate 22, and the orthographic projection of the first plate 22 on the base substrate includes an orthographic projection of the opening on the base substrate. In an exemplary embodiment, the opening is configured to contain a subsequently formed first via V1, wherein the first via V1 is located within the opening and exposes the first plate 22, connecting the second electrode of the first transistor formed later with the first plate 22.

In some examples, the plate connecting line is arranged between the second plates 34 of the circuit units adjacent to each other in the first direction X or in a direction opposite to the first direction X. A first end of the plate connecting line is connected to the second plate 34 of this circuit unit, and a second end of the plate connecting line extends in the first direction X or in the direction opposite to the first direction X and is connected to the second plates 34 in an adjacent circuit unit. That is, the plate connecting line is configured to connect the second plates 34 of the circuit units adjacent to each other in one unit row 10 together. In some examples, the second plates 34 of the plurality of circuit units in one unit row 10 may form a one-piece structure connected to each other through the plate connecting line, and the second plates 34 of the one-piece structure may be multiplexed as a power signal line, ensuring that the plurality of second plates 34 in one unit row 10 have a same potential, which is beneficial to improving uniformity of the display panel, avoiding poor display of the display panel, and ensuring a good display effect of the display panel.

In some examples, the first transistor and the second transistor in the pixel driving circuit adopt a double gate structure. A region where the first part 32 of the reset signal line overlaps the active layer 41 of the first transistor to be formed serves as a first gate electrode of the first transistor. For example, the first part 32 of the reset signal line is provided with a gate block 32-1 protruding toward the second scan signal line, and the gate block 32-1 serves as the first gate electrode of the first transistor. A region where the first part 33 of the second scan line overlaps with the active layer 42 of the second transistor to be formed serves as a first gate electrode of the second transistor. For example, the first part 33 of the second scan line is provided with a plurality of protruding gate blocks 33-1, the gate block 33-1 serves as the first gate of the second transistor.

Figure 8:
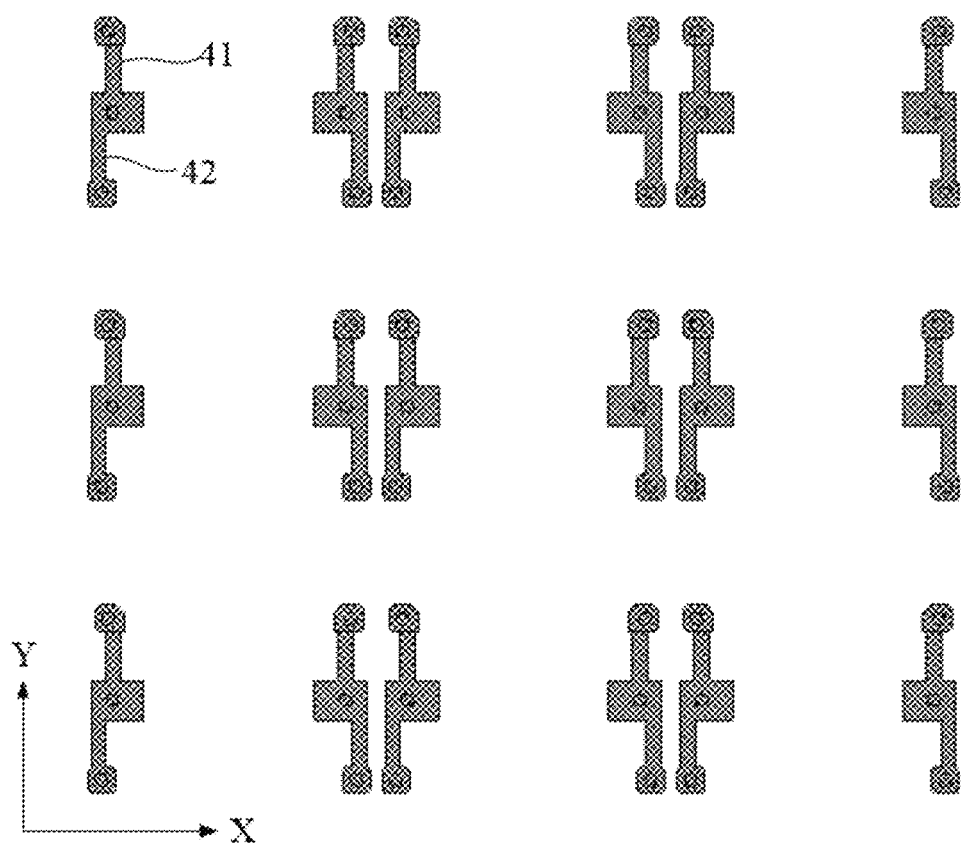
FIG. 8 is a layout of a second semiconductor layer of the display panel according to an embodiment of the present disclosure.

(5) A pattern of the second semiconductor layer is formed. In some examples, forming the pattern of the second semiconductor layer includes depositing a fourth insulating layer film and a second semiconductor film on the base substrate with the above-described patterns, and patterning the first semiconductor film through a patterning process, to form the fourth insulating layer covering the second conductive layer and the second semiconductor layer arranged on the fourth insulating layer, as shown in FIG. 8.

In some examples, the active layer 41 of the first transistor and the active layer 42 of the second transistor in the circuit unit in the $M^{th}$ row are located on a side of the active layer 11 of the third transistor in the circuit unit in this row away from the circuit unit in the $(M+1)^{th}$ row.

In some examples, the second semiconductor layer in each circuit unit includes the active layer 41 of the first transistor and the active layer 42 of the second transistor. In some examples, a second region of the first transistor is also a first region of the second transistor.

In some examples, the shapes of the active layer 41 of the first transistor and the active layer 42 of the second transistor may be in a shape of "1".

(6) A pattern of the third conductive layer is formed. In some examples, forming the pattern of the third conductive layer may include sequentially depositing a fifth insulating film and a third conductive film on the base substrate with the above-described patterns, patterning the third conductive film through a patterning process, to form the fifth insulating layer covering the second semiconductor layer and the pattern of the third conductive layer on the fifth insulating layer. The pattern of the second conductive layer at least includes the second part 51 of the reset signal line and the second part 52 of the second scan line, as shown in FIG. 9.

Figure 9:
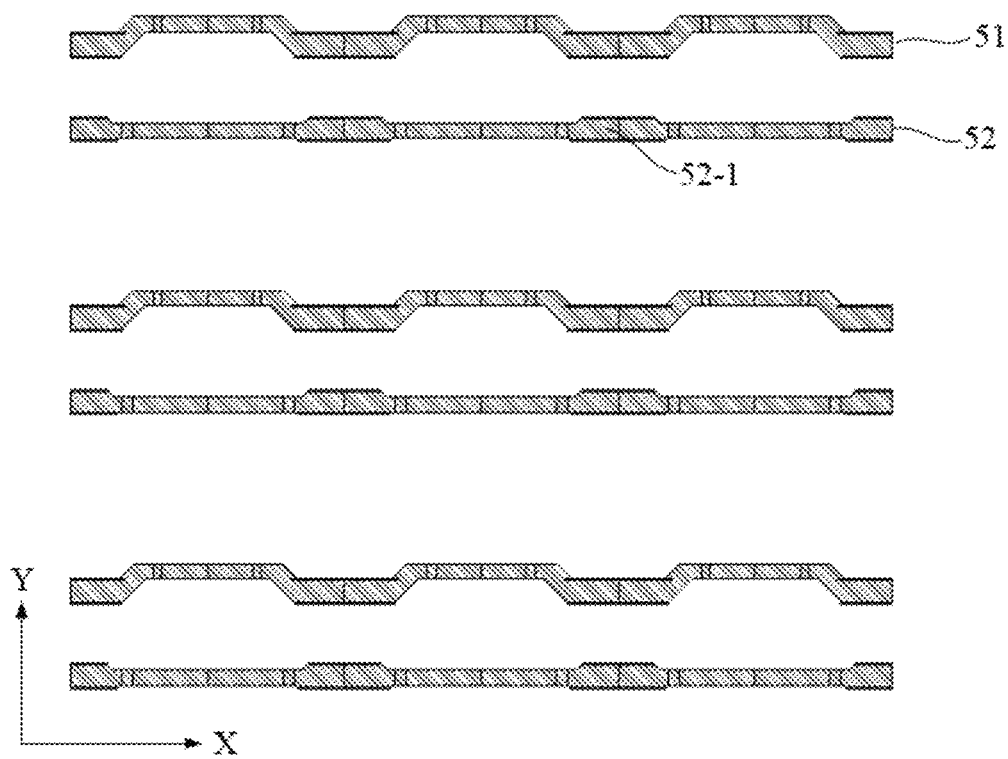
FIG. 9 is a layout of a third conductive layer of the display panel according to an embodiment of the present disclosure.
Figure 10:
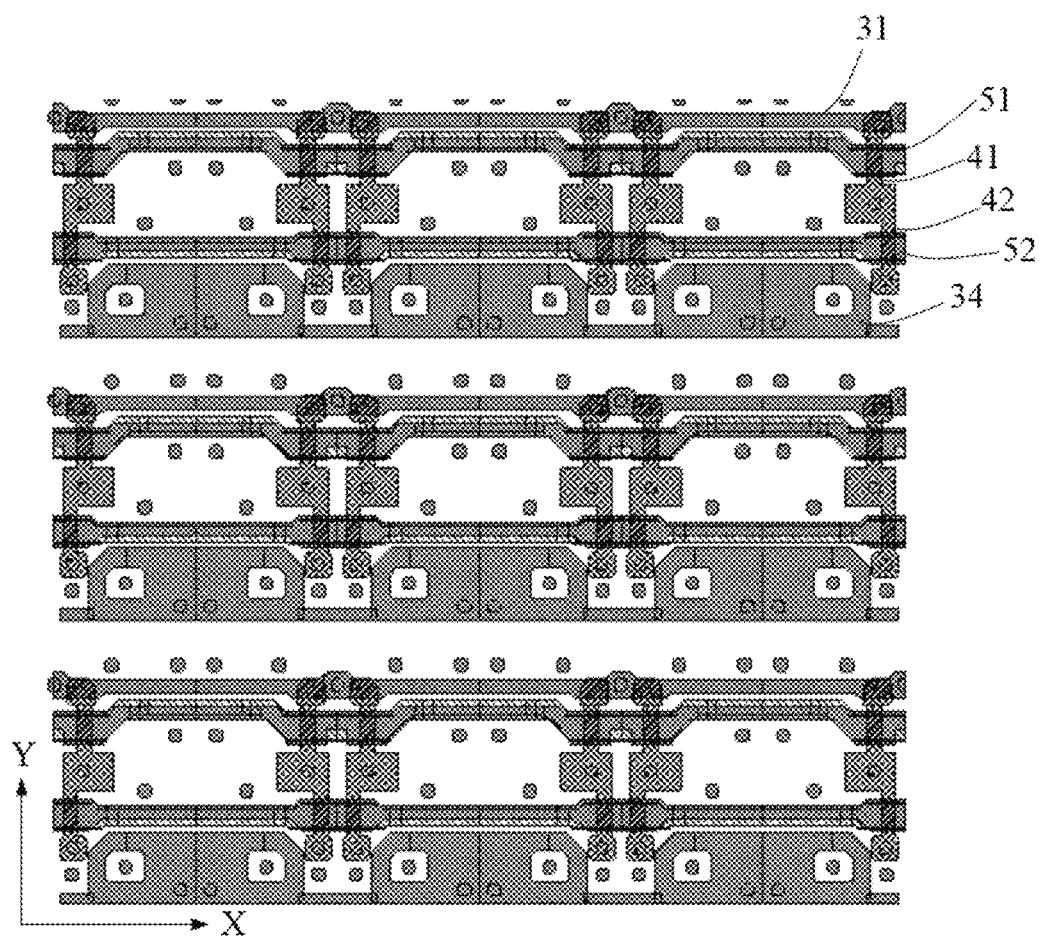
FIG. 10 is a layout of the second conductive layer, the second semiconductor layer, and the third conductive layer, which are stacked together, of the display panel according to an embodiment of the present disclosure.

As shown in FIGS. 9 and 10, the second part 51 of the reset signal line and the second part 52 of the second scan line extend in the first direction X. The second part 51 of the reset signal line has a same pattern or a substantially same pattern as the first part 32 of the reset signal line. Further, orthographic projections of the second part 51 of the reset signal line and the first part 32 of the reset signal line arranged opposite to the second part 51 of the reset signal line on the base substrate substantially coincide with each other. Orthographic projections of the second part 52 of the second scan line and the first part 33 of the second scan line arranged opposite to the second part 52 of the second scan line on the base substrate substantially coincide with each other.

In some examples, a region where the second part 51 of the reset signal line overlaps the active layer 41 of the first transistor serves as a second gate electrode of the first transistor, i.e., a double gate structure of the first transistor is formed. A region where the second part 52 of the second scan line overlaps the active layer 42 of the second transistor serves as a second gate electrode of the second transistor, i.e., a double gate structure of the second transistor is formed.

(7) A pattern of the sixth insulating layer is formed. In some examples, forming the pattern of the sixth insulating layer may include depositing a sixth insulating film on the base substrate with the above-described patterns, patterning the sixth insulating film through a patterning process, to form a sixth insulating layer covering the second conductive layer. Each circuit unit is provided with a plurality of vias. The plurality of vias at least include a first via V1, a second via V2, a third via V3, a fourth via V4, a fifth via V5, a sixth via V6, a seventh via V7 and an eighth via V8.

As shown in FIG. 11, an orthographic projection of the first via V1 on the base substrate is within an orthographic projection of the first region of the active layer 41 of the first transistor on the base substrate. Parts of the fifth insulating layer and the sixth insulating layer in the first via V1 are etched away, to expose the first region of the active layer 41 of the first transistor. The first via V1 is configured to electrically connect the subsequently formed first connecting electrode 62 with the first region of the first transistor.

In some examples, an orthographic projection of the second via V2 on the base substrate is within an orthographic projection of the first region of the active layer 12 of the fourth transistor on the base substrate, and parts of the second insulating layer, the third insulating layer, the fourth insulating layer, the fifth insulating layer and the sixth insulating layer in the second via V2 are etched away, to expose the first region of the active layer 12 of the fourth transistor. The second via V2 is configured to electrically connect the subsequently formed third connecting electrode 64 with the first region of the active layer 12 of the fourth transistor.

In some examples, the third via V3 is located within the opening of the second plate 34, and an orthographic projection of the third via V3 on the base substrate is within an orthographic projection of the gate electrode of the third transistor on the base substrate. Parts of the third insulating layer, the fourth insulating layer, the fifth insulating layer, and the sixth insulating layer in the third via V3 are etched away, to expose a surface of the first plate 22 of the storage capacitor. The third via V3 is configured to connect the subsequently formed fourth connecting electrode 65 with the first plate 22 of the storage capacitor.

An orthographic projection of the fourth via V4 on the base substrate is within an orthographic projection of the second region of the active layer 41 of the first transistor and the first region of the second transistor on the base substrate. Parts of the fifth insulating layer and the sixth insulating layer in the fourth via V4 are etched away, to expose the second region of the active layer 41 of the first transistor and the first region of the second transistor. The fourth via V4 is configured to electrically connect the subsequently formed fourth connecting electrode 65 with the second region of the active layer 41 of the first transistor and the first region of the second transistor, to achieve electrical connection between the first plate 22 of the storage capacitor (the gate electrode of the third transistor) in the pixel driving circuit and the drain electrode of the first transistor and the source electrode of the second transistor, through the fourth connecting electrode 65.

In some examples, an orthographic projection of the fifth via V5 on the base substrate is within an orthographic projection of the second region of the active layer 11 of the third transistor on the base substrate. Parts of the second insulating layer, the third insulating layer, the fourth insulating layer, the fifth insulating layer and the sixth insulating layer in the fifth via V5 are etched away, to expose the second region of the active layer 11 of the third transistor. The fifth via V5 is configured to electrically connect the subsequently formed fifth connecting electrode 66 with the second region of the third transistor.

An orthographic projection of the sixth via V6 on the base substrate is within an orthographic projection of the second region of the active layer 42 of the second transistor on the base substrate. Parts of the fifth insulating layer and the sixth insulating layer in the sixth via V6 are etched away, to expose the second region of the second transistor. The sixth via V6 is configured to electrically connect the subsequently formed fifth connecting electrode 66 with the second region of the active layer 42 of the second transistor, to achieve electrical connection between the drain electrode of the third transistor and the drain electrode of the second transistor, through the fifth connecting electrode 66.

In some examples, an orthographic projection of the seventh via V7 on the base substrate is within an orthographic projection of the second region of the active layer 14 of the sixth transistor on the base substrate. Parts of the second insulating layer, the third insulating layer, the fourth insulating layer, the fifth insulating layer and the sixth insulating layer in the seventh via V7 are etched away, to expose the second region of the active layer 14 of the sixth transistor. The seventh via V7 is configured to electrically connect the subsequently formed sixth connecting electrode 67 with the second region of the active layer 14 of the sixth transistor.

In some examples, an orthographic projection of the eighth via V8 on the base substrate is within an orthographic projection of the second plate 34 of the storage capacitor on the base substrate. Parts of the fourth insulating layer, the fifth insulating layer and the sixth insulating layer in the eighth via V8 are etched away, to expose a surface of the second plate 34 of the storage capacitor. The eighth via V8 is configured to electrically connect the subsequently formed second connecting electrode 63 with the second plate 34 of the storage capacitor.

(7) A pattern of the fourth conductive layer is formed. In some examples, forming the pattern of the fourth conductive layer may include depositing a fourth conductive film on the base substrate with the above-described patterns, and patterning the fourth conductive film through a patterning process, to form the pattern of the fourth conductive layer on the sixth insulating layer. The fourth conductive layer includes at least the first connecting electrode 62, the second connecting electrode 63, the third connecting electrode 64, the fourth connecting electrode 65, the fifth connecting electrode 66, the sixth connecting electrode 67, and the third signal sub-line 61 of the second initial signal line, as shown in FIG. 11.

In some examples, an extending direction of the third signal sub-line 61 of the second initial signal line is the first direction X. The third signal sub-line 61 in the circuit unit in the $M^{th}$ row is located on a side of the first signal sub-line 31 in the circuit unit in this row close to the circuit unit in the $(M+1)^{th}$ row.

In some examples, the first connecting electrode 62 in the $N^{th}$ circuit unit in the $M^{th}$ row and the first connecting electrode 62 in the $(N+1)^{th}$ circuit unit in the $M^{th}$ row are connected together as a one-piece structure. The first connecting electrode 62 covers the first connecting via, and is configured to electrically connect the first signal sub-line 31 and the subsequently formed second signal sub-line 73 of the first initial signal line together.

In some examples, the second connecting electrode 63 is a block structure configured to short the subsequently formed first power line 71 to reduce resistance. The second connecting electrodes 63 in every two circuit units adjacent to each other in the first direction X are connected together as a one-piece structure. The second connecting electrode 63 covers the eighth via V8, and connects the second plate 34 of the storage capacitor to the subsequently formed first power line 71.

In some examples, the third connecting electrode 64 may be a pad structure. Each third connecting electrode 64 covers one second via V2. That is, the third connecting electrodes 64 are arranged in one-to-one correspondence with the second vias V2 and each are configured to electrically connect the first region (source electrode) of the active layer 12 of the fourth transistor with the subsequently formed data line 72.

In some examples, the fourth connecting electrode 65 covers the third via V3 and the fourth via V4, and is configured to electrically connect the first plate 22 of the storage capacitor (the gate electrode of the third transistor) in the pixel driving circuit with the second region (drain electrode) of the active layer 41 of the first transistor and the first region (source electrode) of the active layer 42 of the second transistor through the third via V3 and the fourth via V4, respectively.

In some examples, the fifth connecting electrode 66 covers the fifth via V5 and the sixth via V6, and is configured to electrically connect the second region (drain electrode) of the active layer 11 of the third transistor in the pixel driving circuit with the second region (drain electrode) of the active layer 42 of the second transistor through the fifth via V5 and the sixth via V6.

In some examples, the sixth connecting electrode 67 covers the seventh via V7, and is configured to electrically connect the second region (drain electrode) of the active layer 14 of the sixth transistor with an anode of the subsequently formed light emitting device through the seventh via V7.

(8) A pattern of the seventh insulating layer is formed. In some examples, forming the pattern of the seventh insulating layer may include depositing a seventh insulating film on the base substrate with the above-described patterns, patterning the seventh insulating film through a patterning process, to form the seventh insulating layer covering the third conductive layer. A plurality of vias arranged in each circuit unit further include a ninth via V9, a tenth via V10, an eleventh via V11, a twelfth via V12, and a thirteenth via V13.

As shown in FIGS. 12 and 13, an orthographic projection of the ninth via V9 on the base substrate is within an orthographic projection of the first connecting electrode 62 on the base substrate. A part of the seventh insulating layer in the ninth via V9 is etched away, to expose the first connecting electrode 62. The ninth via V9 is configured to electrically connect the subsequently formed second signal sub-line 73 of the first initial signal line with the first connecting electrode 62, to achieve electrical connection between the first signal sub-line 31 and the second signal sub-line 73 of the first initial signal line.

In some examples, an orthographic projection of the tenth via V10 on the base substrate is within an orthographic projection of the third signal sub-line 61 of the second initial signal line on the base substrate. A part of the seventh insulating layer in the tenth via V10 is etched away, to expose the third signal sub-line 61 of the second initial signal line. The tenth via V10 is configured to electrically connect the subsequently formed fourth signal sub-line 74 of the second initial signal line with the first connecting electrode 62, to achieve electrical connection between the third signal sub-line 61 and the fourth signal sub-line of the second initial signal line.

In some examples, an orthographic projection of the eleventh via V11 on the base substrate is within an orthographic projection of the second connecting electrode 63 on the base substrate. A part of the seventh insulating layer in the eleventh via V11 is etched away, to expose the second connecting electrode 63. The eleventh via V11 is configured to electrically connect the subsequently formed first power line 71 with the second connecting electrode 63 to form a conductive mesh structure, while achieving electrical connection between the first power line 71 and the second plate 34 of the storage capacitor.

In some examples, an orthographic projection of the twelfth via V12 on the base substrate is within an orthographic projection of the third connecting electrode 64 on the base substrate. A part of the seventh insulating layer in the twelfth via V12 is etched away, to expose the third connecting electrode 64. The twelfth via V12 is configured to electrically connect the subsequently formed data line 72 with the third connecting electrode 64, to achieve electrical connection between the first region (source electrode) of the active layer 12 of the fourth transistor and the data line 72.

In some examples, an orthographic projection of the thirteenth via V13 on the base substrate is within an orthographic projection of the sixth connecting electrode 67 on the base substrate. A part of the seventh insulating layer in the thirteenth via V13 is etched away, to expose the sixth connecting electrode 67. The thirteenth via V13 is configured to electrically connect a subsequently formed seventh connecting electrode 75 with the sixth connecting electrode, to achieve electrical connection between the subsequently formed anode of the light emitting device with the second region (drain electrode) of the active layer 14 of the sixth transistor.

(9) A pattern of the fifth conductive layer is formed. In some examples, forming the pattern of the fifth conductive layer may include depositing a fifth conductive film on the base substrate with the above-described patterns, and patterning the fifth conductive film through a patterning process, to form the pattern of the fifth conductive layer on the seventh insulating layer. The fifth conductive layer includes at least the first power line 71, the second signal sub-line 73 of the first initial signal line, the fourth signal sub-line 74 of the second initial signal line, the data line 72, and the seventh connecting electrode 75, as shown in FIGS. 12 and 13.

In some examples, the first power line 71, the second signal sub-line 73 of the first initial signal line, the fourth signal sub-line 74 of the second initial signal line, and the data line 72 all extend in the second direction Y. The first power line 71, the second signal sub-line 73 of the first initial signal line, the fourth signal sub-line 74 of the second initial signal line, and the data line 72 may be straight lines or bent lines. In FIG. X, it is taken as an example that the second signal sub-line 73 of the first initial signal line, the fourth signal sub-line 74 of the second initial signal line, and the data line 72 are straight lines, and the first power line 71 is a bent line. In some examples, the first power line 71 in the circuit unit includes the first line segment 71-1 and the second line segment 71-2 extending in the second direction Y and electrically connected to each other. In the unit column 20, the first line segment 71-1 of the first power line 71 in one of two circuit units adjacent to each other is electrically connected to the second line segment 71-2 in the other of two circuit units adjacent to each other. In the unit structure 100, a distance between the second line segments 71-2 adjacent to each other in the first direction X is less than a distance between the first line segments 71-1 adjacent to each other in the first direction X. In each unit structure 100, the second line segments 71-2 adjacent to each other in the first direction X are shorted, and in this case, all the respective first power lines 71 form a similar conductive mesh structure, whereby the resistance can be reduced.

In some examples, the second signal sub-line 73 of the first initial signal line is connected to the first connecting electrode 62 through the ninth via V9, to achieve electrical connection between the first signal sub-line 31 with the second signal sub-line 73 of the first initial signal line.

In some examples, the fourth signal sub-line 74 of the second initial signal line is electrically connected to the third signal sub-line 61 through the tenth via V10.

In some examples, the first power line 71 is connected to the second connecting electrode 63 through an eleventh via V11, to achieve electrical connection between the second plate 34 of the storage capacitor and the first power line 71.

In some examples, the data line 72 is connected to the third connecting electrode 64 through the twelfth via V12, to achieve electrical connection between the data line 72 and the first region of the active layer 12 of the fourth transistor.

In some examples, the seventh connecting electrode 75 is electrically connected to the sixth connecting electrode 67 through a thirteenth via V13, to achieve electrical connection between the drain electrode of the sixth transistor and the subsequently formed anode of the light emitting device.

Figure 15:
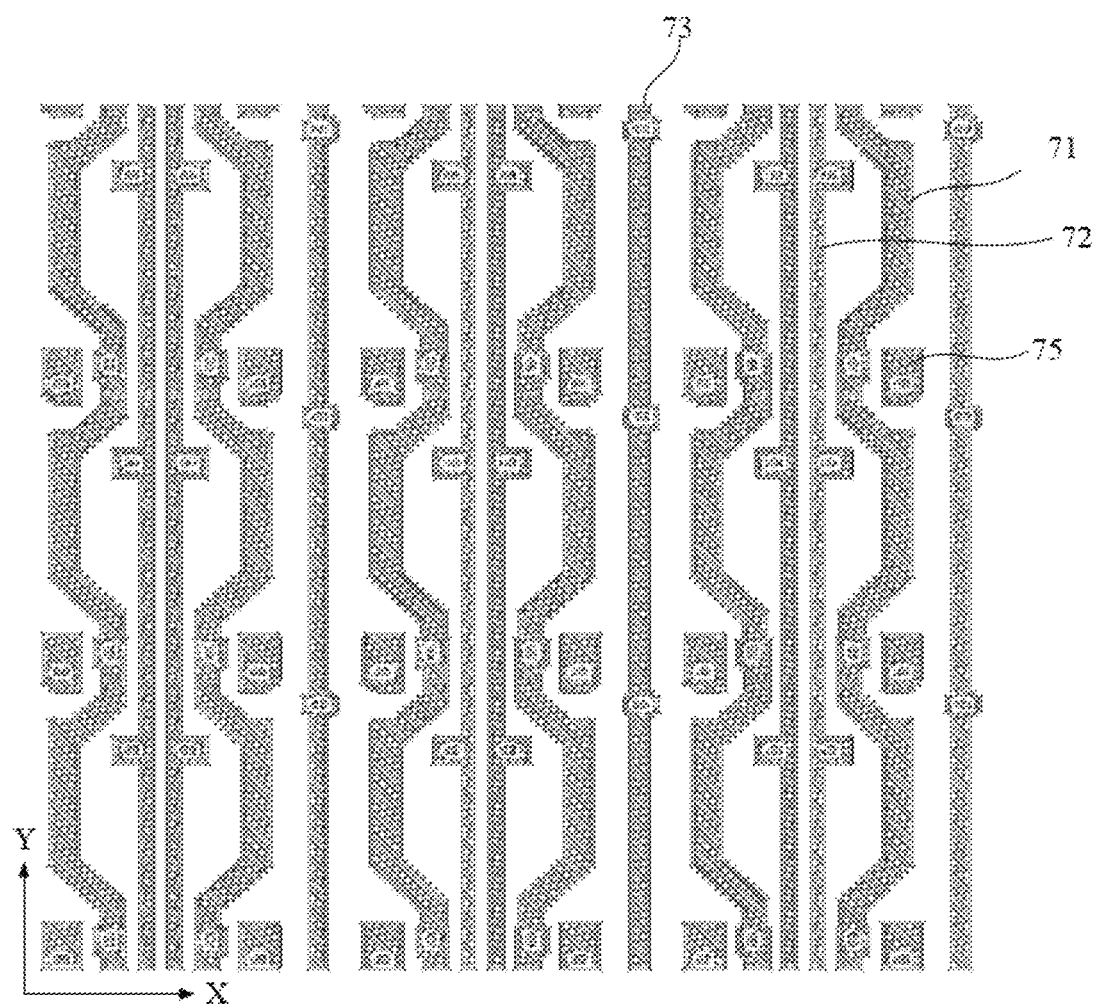
FIG. 15 is another layout of the fifth conductive layer of the display panel according to an embodiment of the present disclosure.

It should be noted that, as shown in FIG. 15, only the first initial signal line includes the first signal sub-line 31 and the second signal sub-line 73. In this case, compared with the first conductive layer shown in FIG. 12, only the fourth signal sub-line 74 is missing in the first conductive layer of FIG. 15, and other structures are the same as those in FIG. 12. Similarly, only the second initial signal line includes the third signal sub-line 61 and the fourth signal sub-line 74. In this case, compared with the first conductive layer shown in FIG. 12, only the second signal sub-line 73 is missing in the first conductive layer of the display panel, and other structures are the same as those in FIG. 12, and therefore, the description thereof is not repeated herein.

(10) A pattern of the first planarization layer is formed. In some examples, forming the pattern of the first planarization layer may include coating a first planarization film on the base substrate with the above-described patterns, patterning the first planarization film through a patterning process, to form the first planarization layer covering the fifth conductive layer. The fourteenth via V14 is formed in the first planarization layer.

Figure 16:
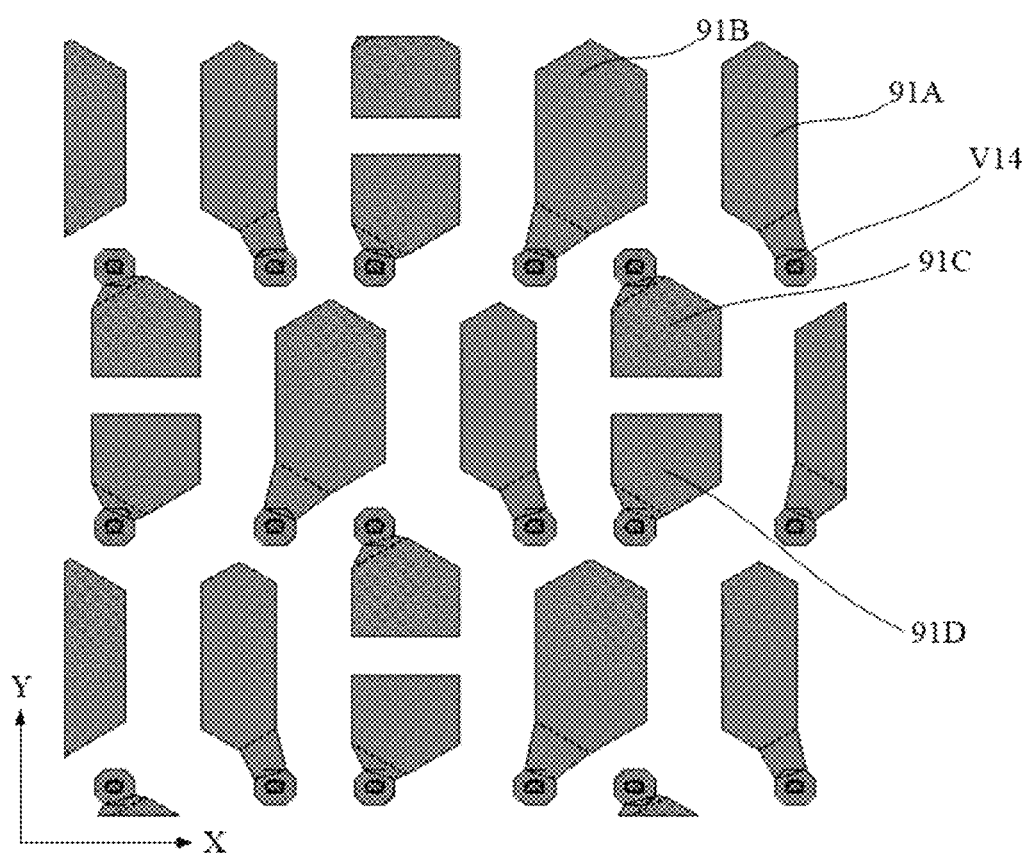
FIG. 16 is a layout of a sixth conductive layer of the display panel according to an embodiment of the present disclosure.

As shown in FIG. 16, an orthographic projection of the fourteenth via V14 on the base substrate is within an orthographic projection of the seventh connecting electrode 75 on the base substrate. A part of the first planarization layer in the fourteenth via V14 is removed, to expose a surface of the seventh connecting electrode 75. The fourteenth via V14 is configured to connect a subsequently formed anode with the seventh connecting electrode 75 through this via.

Thus, the manufacturing of the driving circuit layer on the base substrate is completed.

In some examples, after the driving circuit layer is manufactured, a light emitting structure layer is formed on the driving circuit layer. A manufacturing procedure of the light emitting structure layer may include the following operations.

(11) An pattern of the anode is formed. In some examples, forming the pattern of the anode may include depositing a sixth conductive film on the base substrate with the above-described patterns, and patterning the sixth conductive film by a patterning process, to form an pattern of the anode on the second planarization layer. The anodes form a GGRB pixel arrangement, as shown in FIG. 16.

As shown in FIG. 16, the pattern of the anode may include a first anode 91A of a red light emitting device, a second anode 91B of a blue light emitting device, a third anode 91C of a first green light emitting device, and a fourth anode 91D of a second green light emitting device. A region where the first anode 91A exists may form the red sub-pixel R emitting red light, a region where the second anode 91B exists may form the blue sub-pixel B emitting blue light, a region where the third anode 91C exists may form the first green sub-pixel G1 emitting green light, and a region where the fourth anode 91D exists may form the second green sub-pixel G2 emitting green light. The red sub-pixel R and the blue sub-pixel B are sequentially arranged in the second direction Y, the first green sub-pixel G1 and the second green sub-pixel G2 are sequentially arranged in the second direction Y. The first green sub-pixel G1 and the second green sub-pixel G2 are arranged on a side of the red sub-pixel R and the blue sub-pixel B in the first direction X, respectively. The red sub-pixel R, the blue sub-pixel B, the first green sub-pixel G1, and the second green sub-pixel G2 form one pixel unit.

In some examples, in one pixel unit, the first anode 91A is electrically connected to the seventh connecting electrode 75 in the circuit unit in the $M^{th}$ row and $N^{th}$ column through the fourteenth via V14 in this circuit unit, the second anode 91B is connected to the seventh connecting electrode 75 in the circuit unit in the $(M+1)^{th}$ row and $N^{th}$ column through the fourteenth via V14 in this circuit unit, the third anode 91C is connected to the seventh connecting electrode 75 in the circuit unit in the $M^{th}$ row and $(N+1)^{th}$ column through the fourteenth via V14 in this circuit unit, and the fourth anode 91D is connected to the seventh connecting electrode 75 in the circuit unit in the $(M+1)^{th}$ row and $(N+1)^{th}$ column through the fourteenth via V14 in this circuit unit. In another pixel unit, the first anode 91A is connected to the seventh connecting electrode 75 in the circuit unit in the $(M+1)^{th}$ row and $(N+2)^{th}$ column through the fourteenth via V14 in this circuit unit, the second anode 91B is connected to the seventh connecting electrode 75 in the circuit unit in the $M^{th}$ row and $(N+2)^{th}$ column through the fourteenth via V14 in this circuit unit, the third anode 91C is connected to the seventh connecting electrode 75 in the circuit unit in the $(M+1)^{th}$ row and $(N+3)^{th}$ column through the fourteenth via V14 in this circuit unit, and the fourth anode 91D is connected to the seventh connecting electrode 75 in the circuit unit in the $M^{th}$ row and $(N+3)^{th}$ column through the fourteenth via V14 in this circuit unit.

In some examples, since the seventh connecting electrode 75 in at least one circuit unit is connected to the sixth connecting electrode 67 through the thirteenth via V13, and the sixth connecting electrode 67 is connected to the second region of the active layer 14 of the sixth transistor through the sixth via V6, the four anodes in the at least one pixel unit are respectively and correspondingly connected to the pixel driving circuits of four circuit units in one circuit unit group, so that the pixel driving circuits can drive the light emitting devices to emit light.

In some examples, the shapes and positions of the first anodes 91A in different pixel units may be the same as or different from each other. The shapes and positions of the second anodes 91B in different pixel units may be the same as or different from each other. The shapes and positions of the third anodes 91C in different pixel units may be the same as or different from each other. The shapes and positions of the fourth anodes 91D in different pixel units may be the same as or different from each other. In some examples, two first anodes 91A connected to the pixel driving circuit in the circuit unit in the $M^{th}$ row and $N^{th}$ column and the pixel driving circuit in the circuit unit in the $(M+1)^{th}$ row and $(N+2)^{th}$ column, respectively, are the same in shape and position, two second anodes 91B connected to the pixel driving circuit in the circuit unit in the $(M+1)^{th}$ row and $N^{th}$ column and the pixel driving circuit in the circuit unit in the $M^{th}$ row and $(N+2)^{th}$ column, respectively, are the same in shape and position, two third anodes 91C connected to the pixel driving circuit in the circuit unit in the $M^{th}$ row and $(N+1)^{th}$ column and the pixel driving circuit in the circuit unit in the $(M+1)^{th}$ row and $(N+3)^{th}$ column, respectively, are the same in shape and position, and two fourth anodes 91D connected to the pixel driving circuit in the circuit unit in the $(M+1)^{th}$ row and $(N+1)^{th}$ column and the pixel driving circuit in the circuit unit in the $M^{th}$ row and $(N+3)^{th}$ column, respectively, are the same in shape and position.

In some examples, the shapes and areas of the anodes of four sub-pixels in one pixel unit may be the same or different from each other. In some examples, the first anode 91A, the second anode 91B, the third anode 91C, and the fourth anode 91D in one pixel unit all have different shapes and different areas from each other.

In some examples, the first anode 91A in the red sub-pixel may include a first anode body portion, and a shape of the first anode body portion may be similar to a hexagon. In an exemplary embodiment, the first anode 91A may further include a first bump 91-1 and a second bump 91-2, and each of the first bump 91-1 and the second bump 91-2 is connected to the first anode body portion. The first bump 91-1 may be a rectangle protruding toward the gate electrode of the third transistor T3 in the pixel driving circuit connected to the first anode, the second bump 91-2 may be a rectangle protruding toward the sixth transistor T6 in the pixel driving circuit connected to the first anode. The first bump 91-1 and the second bump 91-2 are configured to adjust a parasitic capacitance at an N3 node in the pixel driving circuit connected to the anode, and reduce a difference between the parasitic capacitances at the N3 nodes in the circuit units adjacent to each other, to reduce a difference in luminance and improve the display effect.

In some examples, the second anode 91B in the blue sub-pixel may include a second anode body portion, and a shape of the second anode body portion may be similar to a hexagon. In an exemplary embodiment, the second anode 91B may further include a third bump 91-3, a fourth bump 91-4, and a fifth bump 91-5, and each of the third bump 91-3, the fourth bump 91-4, and the fifth bump 91-5 is connected to the second anode body portion. The third bump 91-3 may be a rectangle protruding toward the first power line 71 in the pixel driving circuit connected to the second anode, the fourth bump 91-4 may be a rectangle protruding away from the first power line 71 in the pixel driving circuit connected to the second anode, the fifth bump 91-5 may be a polygon protruding toward the sixth transistor T6 in the pixel driving circuit connected to the second anode. The third bump 91-3, the fourth bump 91-4, and the fifth bump 91-5 may be configured to adjust a parasitic capacitance at a connecting node in the pixel driving circuit connected to the second anode, and reduce a difference between the parasitic capacitances at the connecting nodes in the circuit units adjacent to each other, to reduce the difference in luminance and improve the display effect.

In some examples, the third anode 91C may include a third anode body portion, and a shape of the third anode body portion may be similar to a pentagon. In an exemplary embodiment, the third anode 91C may further include a sixth bump 91-6, and the sixth bump 91-6 is connected to the third anode body portion. The sixth bump 91-6 may be a rectangle protruding toward the sixth transistor T6 in the pixel driving circuit connected to the third anode. The sixth bump 91-6 is configured to adjust the parasitic capacitance at the N3 node in the pixel driving circuit connected to the third anode, and reduce the difference between the parasitic capacitances at the N3 nodes in the circuit units adjacent to each other, to reduce the difference in luminance, particularly the difference in luminance between this sub-pixel and the second green sub-pixel, and improve the display effect.

In some examples, the fourth anode 91D may include a fourth anode body portion, and a shape of the fourth anode body portion may be similar to a pentagon. In an exemplary embodiment, the fourth anode 91D may further include a seventh bump 91-7, and the seventh bump 91-7 may be connected to the fourth anode body portion. The seventh bump 91-7 may be of a stripe shape protruding toward the gate electrode of the third transistor T3 in the pixel driving circuit connected to the fourth anode. The seventh bump 91-7 is configured to adjust the parasitic capacitance at the N3 node in the pixel driving circuit connected to the fourth anode, and reduce the difference between the parasitic capacitances at the N3 nodes in the circuit units adjacent to each other, to reduce the difference in luminance, particularly the difference in luminance between this sub-pixel and the first green sub-pixel, and improve the display effect.

(12) A pattern of a pixel defining layer is formed. In an exemplary embodiment, forming the pattern of the pixel defining layer may include coating a pixel defining film on the base substrate with the above-described patterns, and patterning the pixel defining film through a patterning process, to form the pattern of the pixel defining layer.

The pattern of the pixel defining layer 72 may include a first pixel opening 73A exposing the first anode 91A, a second pixel opening 73B exposing the second anode 91B, a third pixel opening 73C exposing the third anode 91C, and a fourth pixel opening 73D exposing the fourth anode 91D.

In some examples, the subsequent manufacturing procedure may include: forming an organic light emitting layer through an evaporation or ink-jet printing process, wherein the organic light emitting layer is connected to the anode through the pixel opening, a cathode is formed on the organic light emitting layer, and the cathode is connected to the organic light emitting layer; and forming an encapsulation layer, wherein the encapsulation layer may include a first encapsulation layer, a second encapsulation layer and a third encapsulation layer which are stacked together, the first encapsulation layer and the third encapsulation layer may be made of inorganic materials, the second encapsulation layer may be made of an organic material, the second encapsulation layer is arranged between the first encapsulation layer and the third encapsulation layer, so that it can be ensured that external water vapor cannot enter the light emitting structure layer.

In some examples, the base substrate may be a flexible base substrate, or may be a rigid base substrate. The rigid base substrate may be, but is not limited to, one or more of glass and quartz. The flexible base substrate may be, but is not limited to, one or more of polyethylene terephthalate, ethylene terephthalate, polyetheretherketone, polystyrene, polycarbonate, polyarylate, polyimide, polyvinyl chloride, polyethylene, and textile fibers. In an exemplary embodiment, the flexible base substrate may include a first flexible material layer, a first inorganic material layer, a semiconductor layer, a second flexible material layer, and a second inorganic material layer, which are stacked together. The first flexible material layer and the second flexible material layer each may be made of a material such as Polyimide (P1), polyethylene terephthalate (PET), or a surface-treated polymer film. The first inorganic material layer and the second inorganic material layer may be made of silicon nitride (SiNx), silicon oxide (SiOx), or the like, for improving the water and oxygen resistance of the base substrate. The semiconductor layer may be made of amorphous silicon (a-si).

In an exemplary embodiment, the first conductive layer, the second conductive layer, the third conductive layer, the fourth conductive layer, the fifth conductive layer and the shielding electrode layer each may adopt a metal material, such as any one or more of silver (Ag), copper (Cu), aluminum (Al), and molybdenum (Mo), or an alloy material of the above metals, such as aluminum neodymium alloy (AlNd) or molybdenum niobium alloy (MoNb), and may be of a single-layer structure or a multi-layer composite structure, such as Mo/Cu/Mo, or the like. The first insulating layer, the second insulating layer, the third insulating layer, the fourth insulating layer, the fifth insulating layer, the sixth insulating layer, the seventh insulating layer, and the first planarization layer may adopt any one or more of silicon oxide (SiOx), silicon nitride (SiNx), and silicon oxynitride (SiON), and may be of a single layer, a multilayer, or a composite layer. The first semiconductor layer may be made of a silicon-containing material such as amorphous silicon (a-Si) or poly-silicon (p-Si). The second semiconductor layer may be formed of an Oxide material such as amorphous indium gallium zinc Oxide (a-IGZO), zinc oxynitride (ZnON), Indium Zinc Tin Oxide (IZTO), or the like. The first planarization layer may be made of an organic material such as resin or the like. The sixth conductive layer may have a single-layer structure such as Indium Tin Oxide (ITO) or Indium Zinc Oxide (IZO), or may have a multi-layer structure such as ITO/Ag/ITO. The pixel defining layer may be made of polyimide, acryl, or polyethylene terephthalate. The cathode may be made of any one or more of magnesium (Mg), silver (Ag), aluminum (Al), copper (Cu), and lithium (Li), or an alloy made from any one or more of the above metals.

As can be seen from the structure and the manufacturing procedure of the display panel described above, in the display panel provided in the present disclosure, the first initial signal line adopts the first signal sub-line 31 extending in the first direction X and the second signal sub-line 73 extending in the second direction Y, and/or the second initial signal line adopts the third signal sub-line 61 extending in the first direction X and the fourth signal sub-line 74 extending in the second direction Y, so that at least one of the first initial signal line and the second initial signal line forms a mesh structure, which not only effectively reduces the resistance of the initial signal line and reduces the voltage drop of the initial voltage, but also effectively improves the uniformity of the initial voltage in the display panel, effectively improves the display uniformity, and improves the display quality.

In a second aspect, an embodiment of the present disclosure provides a display apparatus, which includes the above-described display panel. The display apparatus may be any product or component having a display function, such as a mobile phone, a tablet computer, a television, a monitor, a notebook computer, a digital photo frame, a navigator, etc., but the embodiment of the present disclosure is not limited thereto.

It will be understood that the above embodiments are merely exemplary embodiments adopted to illustrate the principles of the present disclosure, and the present disclosure is not limited thereto. It will be apparent to one of ordinary skill in the art that various changes and modifications can be made without departing from the spirit and scope of the present disclosure, and these changes and modifications are to be considered within the scope of the present disclosure.

What is claimed is:

1. A display panel, comprising a base substrate, a driving circuit layer on the base substrate and a light emitting structure layer on a side of the driving circuit layer away from the base substrate, wherein the driving circuit layer comprises a plurality of circuit units, and the light emitting structure layer comprises a plurality of light emitting devices; at least one of the plurality of circuit units comprises a plurality of initial signal lines and a pixel driving circuit; the pixel driving circuit comprises a plurality of transistors, which comprise at least one oxide thin film transistor and at least one low-temperature polycrystalline silicon thin film transistor;

the plurality of initial signal lines each comprise a signal sub-line in a first direction, at least one of the plurality of initial signal lines comprises a signal sub-line extending in a second direction; the first direction and the second direction intersect with each other; the signal sub-line extending in the first direction of the initial signal line and the signal sub-line extending in the second direction of the initial signal line are electrically connected to each other;

the driving circuit layer comprises a first semiconductor layer, a first conductive layer, a second semiconductor layer, a third conductive layer, a fourth conductive layer and a fifth conductive layer which are sequentially arranged in a direction away from the base substrate;

the first semiconductor layer comprises an active layer of the low-temperature polycrystalline silicon thin film transistor;

the first conductive layer comprises a gate electrode of the low-temperature polycrystalline silicon thin film transistor;

the second conductive layer comprises a first gate electrode of the oxide thin film transistor and at least one signal sub-line extending in the first direction;

the second semiconductor layer comprises an active layer of the oxide thin film transistor;

the third conductive layer comprises a second gate electrode of the oxide thin film transistor;

the fourth conductive layer comprises at least one signal sub-line extending in the first direction; and the fifth conductive layer comprises the signal sub-line extending in the second direction.

2. The display panel according to claim 1, wherein the plurality of initial signal lines comprise a first initial signal line and a second initial signal line;

the at least one signal sub-line extending in the first direction in the second conductive layer comprises a first signal sub-line of the first initial signal line;

the at least one signal sub-line extending in the first direction in the fourth conductive layer comprises a third signal sub-line of the second initial signal line; and the signal sub-lines extending in the second direction in the fifth conductive layer comprise a third signal sub-line of the first initial signal line, and/or a fourth signal sub-line of the second initial signal line.

3. The display panel according to claim 2, wherein in a case where the first initial signal line comprises the first signal sub-line and the second signal sub-line, the fourth conductive layer further comprises a plurality of first connecting electrodes; the first signal sub-line is electrically connected to a first region of an active layer of a first transistor in the pixel driving circuit through a via; the first region of the active layer of the first transistor is electrically connected to the first connecting electrode through a via; the first connecting electrode is electrically connected to the second signal sub-line through a via; and in a case where the second initial signal line comprises the third signal sub-line and the fourth signal sub-line, the third signal sub-line is electrically connected to the fourth signal sub-line through a via.

4. The display panel according to claim 2, wherein the driving circuit layer comprises a plurality of unit rows and a plurality of unit columns, each of the plurality of unit rows comprises a plurality of circuit units arranged side by side in the first direction; and each of the plurality of unit columns comprises a plurality of circuit units arranged side by side in the second direction;

in a case where the first initial signal line comprises the first signal sub-line and the second signal sub-line, in at least one of the plurality of unit columns, the second signal sub-lines in the circuit units adjacent to each other are connected to each other; and in a case where the second initial signal line comprises the third signal sub-line and the fourth signal sub-line, in at least one of the plurality of unit columns, the fourth signal sub-lines in the circuit units adjacent to each other are connected to each other.

5. The display panel according to claim 4, wherein the plurality of light emitting devices comprise a red light emitting device, a first green light emitting device, a second green light emitting device, and a blue light emitting device; the plurality of circuit units comprise a first circuit unit electrically connected to the red light emitting device, a second circuit unit electrically connected to the blue light emitting device, a third circuit unit electrically connected to the first green light emitting device, and a fourth circuit unit electrically connected to the second green light emitting device; the plurality of unit columns comprise a first unit column and a second unit column, the first unit column comprises the first circuit units and the second circuit units alternately arranged in the second direction, and the second unit column comprises the third circuit units and the fourth circuit units alternately arranged in the second direction;

in a case where the first initial signal line comprises the first signal sub-line and the second signal sub-line, at least a part of the second signal sub-lines are in the second unit column;

in a case where the second initial signal line comprises a third signal sub-line and the fourth signal sub-line, at least a part of the fourth signal sub-lines are in the second unit column.

6. The display panel according to claim 5, wherein the fifth conductive layer further comprises a plurality of first power lines; in a same unit column, the first power lines in the circuit units adjacent to each other are connected to each other; and the second signal sub-line and the fourth signal sub-line are between the first power lines in the two unit columns respectively connected to the second signal sub-line and the fourth signal sub-line.

7. The display panel according to claim 6, wherein the driving circuit layer comprises a plurality of unit structures arranged side by side in the first direction; each of the plurality of unit structures comprises two unit columns which are adjacent to each other;

the first power line in the circuit unit comprises a first line segment and a second line segment extending in a second direction and electrically connected to each other; in the unit column, the first line segment of the first power line in one of the circuit units adjacent to each other is electrically connected to the second line segment in the other of the circuit units adjacent to each other; in the unit structure, a distance between the second segments adjacent to each other in the first direction is less than a distance between the first segments adjacent to each other in the first direction; and the fourth conductive layer further comprises a plurality of second connecting electrodes; in the unit structure, the second connecting electrode electrically connects the second line segments adjacent to each other in the first direction together through vias.

8. The display panel according to claim 6, wherein the fifth conductive layer further comprises a plurality of data lines; in the unit column, the data lines adjacent to each other are connected to each other; and the first power line comprises a first side and a second side which are oppositely arranged in a first direction; the data line in the first unit column is on the first side of the first power line, and the data line in the second unit column is on the second side of the first power line.

9. The display panel according to claim 8, wherein the circuit unit further comprises a third connecting electrode; a first region of an active layer of a fourth transistor is electrically connected to the third connecting electrode through a via; and the third connecting electrode is electrically connected to the data line through a via.

10. The display panel according to claim 2, wherein the fourth conductive layer further comprises a plurality of fourth connecting electrodes; each of the plurality of fourth connecting electrode is electrically connected to a gate electrode of a third transistor in the pixel driving circuit through a via; and a second region of an active layer of a first transistor and a first region of an active layer of a second transistor in the pixel driving circuit are electrically connected to the fourth connecting electrode through a via.

11. The display panel according to claim 2, wherein the fourth conductive layer further comprises a plurality of fifth connecting electrodes;

each of the plurality of fifth connecting electrode is electrically connected to a second region of an active layer of the third transistor in the pixel driving circuit through a via, and a second region of an active layer of a second transistor in the pixel driving circuit is electrically connected to the fifth connecting electrode through a via.

12. The display panel according to claim 2, wherein the fourth conductive layer further comprises a plurality of sixth connecting electrodes and a plurality of seventh connecting electrodes; each of the plurality of sixth connecting electrode is electrically connected to a second region of an active layer of a sixth transistor through a via; the sixth connecting electrode is electrically connected to one of the plurality of seventh connecting electrodes through a via; and an anode of the light emitting device is electrically connected to the seventh connecting electrode through a via.

13. The display panel according to claim 1, further comprising a shielding electrode layer on a side of the first semiconductor layer close to the base substrate, wherein the shielding electrode layer comprises a plurality of shielding electrodes; an orthographic projection of each of the plurality of shielding electrodes on the base substrate covers an orthographic projection of an active layer of a third transistor in the pixel driving circuit on the base substrate.

14. The display panel according to claim 13, wherein the shielding electrodes arranged side by side in the first direction are electrically connected to each other; and the shielding electrodes arranged side by side in the second direction are electrically connected to each other.

15. The display panel according to claim 13, wherein the shielding electrode layer is electrically connected to the corresponding first power line through a via.

16. The display panel according to claim 1,
wherein the first conductive layer further comprises a first scan line, a light emitting control line and a first plate of a storage capacitor in the pixel driving circuit;
the second conductive layer further comprises a second plate of the storage capacitor, a first part of the second scan line and a first part of the first reset signal line; and
the third conductive layer further comprises a second part of the second scan line and a second part of the first reset signal line.

17. A display apparatus, comprising the display panel according to claim 1.

18. The display apparatus according to claim 17, wherein the plurality of initial signal lines comprise a first initial signal line and a second initial signal line;
the at least one signal sub-line extending in the first direction in the second conductive layer comprises a first signal sub-line of the first initial signal line;
the at least one signal sub-line extending in the first direction in the fourth conductive layer comprises a third signal sub-line of the second initial signal line; and
the signal sub-lines extending in the second direction in the fifth conductive layer comprise a third signal sub-line of the first initial signal line, and/or a fourth signal sub-line of the second initial signal line.

19. The display apparatus according to claim 18, wherein in a case where the first initial signal line comprises the first signal sub-line and the second signal sub-line, the fourth conductive layer further comprises a plurality of first connecting electrodes; the first signal sub-line is electrically connected to a first region of an active layer of a first transistor in the pixel driving circuit through a via; the first region of the active layer of the first transistor is electrically connected to the first connecting electrode through a via; the first connecting electrode is electrically connected to the second signal sub-line through a via; and in a case where the second initial signal line comprises the third signal sub-line and the fourth signal sub-line, the third signal sub-line is electrically connected to the fourth signal sub-line through a via.

20. The display apparatus according to claim 18, wherein the driving circuit layer comprises a plurality of unit rows and a plurality of unit columns, each of the plurality of unit rows comprises a plurality of circuit units arranged side by side in the first direction; and each of the plurality of unit columns comprises a plurality of circuit units arranged side by side in the second direction;

in a case where the first initial signal line comprises the first signal sub-line and the second signal sub-line, in at least one of the plurality of unit columns, the second signal sub-lines in the circuit units adjacent to each other are connected to each other; and in a case where the second initial signal line comprises the third signal sub-line and the fourth signal sub-line, in at least one of the plurality of unit columns, the fourth signal sub-lines in the circuit units adjacent to each other are connected to each other.

* * * * *